United States Patent
Kojo

(10) Patent No.: US 11,342,899 B2
(45) Date of Patent: May 24, 2022

(54) CRYSTAL RESONATOR DEVICE

(71) Applicant: Daishinku Corporation, Kakogawa (JP)

(72) Inventor: Takuya Kojo, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 262 days.

(21) Appl. No.: 16/348,492

(22) PCT Filed: Oct. 30, 2017

(86) PCT No.: PCT/JP2017/039112
§ 371 (c)(1),
(2) Date: May 8, 2019

(87) PCT Pub. No.: WO2018/092572
PCT Pub. Date: May 24, 2018

(65) Prior Publication Data
US 2019/0312565 A1    Oct. 10, 2019

(30) Foreign Application Priority Data

Nov. 16, 2016 (JP) .............................. JP2016-223303

(51) Int. Cl.
*H03H 9/10* (2006.01)
*H03H 9/02* (2006.01)
(Continued)

(52) U.S. Cl.
CPC .......... *H03H 9/1021* (2013.01); *H01L 23/02* (2013.01); *H01L 23/08* (2013.01); *H03H 9/02* (2013.01);
(Continued)

(58) Field of Classification Search
CPC ............. H03H 9/02125; H03H 9/0514; H03H 9/0552; H03H 9/1035; H03H 9/19; H03H 9/0547; H03H 9/0595; H03B 5/32
See application file for complete search history.

(56) References Cited

U.S. PATENT DOCUMENTS 9,337,803 B2    5/2016   Takahashi et al.
2007/0229178 A1   10/2007  Harima
(Continued)

FOREIGN PATENT DOCUMENTS

JP   H07-154191 A    6/1995
JP   H11-346119 A   12/1999
(Continued)

OTHER PUBLICATIONS

Machine Translation of JP2008-066921.*
Machine Translation of JP2000-134058.*

*Primary Examiner* — Jeffrey M Shin
(74) *Attorney, Agent, or Firm* — Metrolex IP Law Group, PLLC

(57) ABSTRACT

In a crystal oscillator, a crystal resonator and an IC chip are hermetically sealed in a package. The crystal resonator includes: a crystal resonator plate including a first excitation electrode formed on a first main surface, and a second excitation electrode, which makes a pair with the first excitation electrode, formed on a second main surface; a first sealing member covering the first excitation electrode of the crystal resonator plate; and a second sealing member covering the second excitation electrode of the crystal resonator plate. A vibrating part including the first excitation electrode and the second excitation electrode of the crystal resonator plate is hermetically sealed by bonding the first sealing member to the crystal resonator plate, and the second sealing member to the crystal resonator plate.

9 Claims, 15 Drawing Sheets

(51) Int. Cl.
*H03H 9/05* (2006.01)
*H03H 9/19* (2006.01)
*H01L 23/02* (2006.01)
*H01L 23/08* (2006.01)
*H03B 5/36* (2006.01)

(52) U.S. Cl.
CPC ...... *H03H 9/02102* (2013.01); *H03H 9/0509* (2013.01); *H03H 9/0557* (2013.01); *H03H 9/10* (2013.01); *H03H 9/1035* (2013.01); *H03H 9/19* (2013.01); *H03B 5/36* (2013.01)

(56) References Cited

U.S. PATENT DOCUMENTS

| | | | |
|---|---|---|---|
| 2012/0235762 A1* | 9/2012 | Ii | H03H 9/177 331/158 |
| 2013/0257549 A1 | 10/2013 | Asamura | |
| 2014/0015380 A1 | 1/2014 | Ii et al. | |
| 2014/0361665 A1* | 12/2014 | Hayasaka | H03H 9/1021 310/348 |
| 2014/0368283 A1* | 12/2014 | Shimodaira | H03H 9/02102 331/70 |
| 2015/0214922 A1 | 7/2015 | Ii et al. | |
| 2018/0006630 A1 | 1/2018 | Kojo | |
| 2018/0034442 A1 | 2/2018 | Kojo et al. | |

FOREIGN PATENT DOCUMENTS

| | | |
|---|---|---|
| JP | 2000-134058 A | 5/2000 |
| JP | 2002-009578 A | 1/2002 |
| JP | 2007-251766 A | 9/2007 |
| JP | 2008-069921 * | 3/2008 |
| JP | 2010-252051 A | 11/2010 |
| JP | 2012-199602 A | 10/2012 |
| JP | 2013-172258 A | 9/2013 |
| JP | 2013-207686 A | 10/2013 |
| JP | 2014-103627 A | 6/2014 |
| WO | 2016/121182 A1 | 8/2016 |
| WO | WO 2016/136283 A1 | 9/2016 |

* cited by examiner

CRYSTAL RESONATOR DEVICE

TECHNICAL FIELD

The present invention relates to a crystal resonator device.

BACKGROUND ART

Recently, in various electronic devices, the operating frequencies have increased and the package sizes (especially, the heights/thicknesses) have been decreased. According to such an increase in operating frequency and a reduction in package size/height, there is also a need for crystal resonator devices (such as a crystal resonator and a crystal oscillator) to be adaptable to the increase in operating frequency and the reduction in package size/height.

In this kind of crystal resonator devices, a housing is constituted of a substantially rectangular parallelepiped shaped package. The package is constituted of: a first sealing member and a second sealing member both made of glass or crystal; and a crystal resonator plate made of crystal. On respective main surfaces of the crystal resonator plate, excitation electrodes are formed. The first sealing member and the second sealing member are laminated and bonded via the crystal resonator plate. Thus, a vibrating part of the crystal resonator plate that is disposed in the package (in the internal space) are hermetically sealed (for example, see Patent Document 1). Hereinafter, such a laminated structure of the crystal resonator device is referred to as a sandwich structure.

PRIOR ART DOCUMENT

Patent Document

[Patent Document 1] JP 2010-252051 A

SUMMARY OF THE INVENTION

Problem to Be Solved by the Invention

As described above, in the conventional crystal resonator device having the sandwich structure, the vibrating part of the crystal resonator plate is hermetically sealed, thus the vibrating part of the crystal resonator plate is insulated from the outside. However, in association with package miniaturization and height reduction, it is necessary to form the crystal resonator plate, the first sealing member and the second sealing member such that they each have a small thickness. For this reason, the vibrating part of the crystal resonator may be likely to be affected by changes in the external environment such as the temperature and the atmospheric pressure. That is, due to the changes in the external environment, characteristics of the crystal resonator device (for example, a piezoelectric vibration characteristic of the crystal resonator and an oscillation characteristic of the crystal oscillator) may vary, or noise components may appear in the characteristics of the crystal resonator device.

The present invention was made in consideration of the above circumstances, an object of which is to provide a crystal resonator device including a crystal resonator with a sandwich structure in which characteristic variations caused by changes in the external environment are reduced so as to obtain a high reliability.

Means for Solving the Problem

In order to solve the above problem, the present invention is configured as follows. That is, in the present invention, a crystal resonator device includes a crystal resonator that is hermetically sealed in a package made of an insulating material. The crystal resonator includes: a crystal resonator plate including a first excitation electrode formed on a first main surface, and a second excitation electrode, which makes a pair with the first excitation electrode, formed on a second main surface; a first sealing member covering the first excitation electrode of the crystal resonator plate; and a second sealing member covering the second excitation electrode of the crystal resonator plate. A vibrating part including the first excitation electrode and the second excitation electrode of the crystal resonator plate is hermetically sealed by bonding the first sealing member to the crystal resonator plate and by bonding the second sealing member to the crystal resonator plate. The crystal resonator hermetically sealed in the package may be a single crystal resonator, or may be a crystal resonator with which is integrally formed a sensor element or a circuit element constituting an oscillation circuit.

With the above-described configuration, it is possible to minimize influence on the vibrating part of the crystal resonator caused by changes in the external environment (for example, the temperature and the atmospheric pressure) by doubly hermetically sealing the vibrating part of the crystal resonator. Accordingly, even when the external environment changes, it is possible to reduce characteristic variations of the crystal resonator device, and also to prevent generation of noise components in the characteristics of the crystal resonator device. Therefore, it is possible to improve reliability of the crystal resonator device.

In the above-configured crystal resonator device, it is preferable that the crystal resonator is formed so as to have a substantially rectangular shape in plan view, and the crystal resonator is supported by an inner wall of the package only at one end of the crystal resonator in the long side direction in plan view. It is preferable that the crystal resonator plate of the crystal resonator includes: the vibrating part; an external frame part that surrounds an outer periphery of the vibrating part; and a connecting part that connects the vibrating part to the external frame part, and that is disposed only at another end of the crystal resonator in the long side direction in plan view. Here, the inner wall of the package includes, apart from an inner side wall and an inner bottom wall of the package, a step part that is formed on the inner side wall and the inner bottom wall.

With the above-described configuration, the position where the crystal resonator is supported in the package and the position where the vibrating part is connected on the crystal resonator plate are separated from each other as the one end and the other end of the crystal resonator in the long side direction. Thus, it is possible to ensure a long heat conduction path from the package to the vibrating part of the crystal resonator plate. Therefore, even when the external temperature drastically changes, it is possible to prevent rapid change in the temperature of the vibrating part of the crystal resonator plate, which leads to reduction in characteristic variations of the crystal resonator device and in generation of noise components, both caused by the change in the external temperature.

In the above-configured crystal resonator device, it is preferable that the crystal resonator is formed so as to have a substantially rectangular shape in plan view, and that the crystal resonator is supported by the inner wall of the package at both ends of the crystal resonator in the long side direction in plan view. Also it is preferable that the crystal resonator plate of the crystal resonator includes: the vibrating part; an external frame part that surrounds an outer periphery of the vibrating part; and a connecting part that connects the vibrating part to the external frame part.

With the above-described configuration, by supporting the crystal resonator at both ends thereof in the long side direction, the crystal resonator can be further stably supported by the package, which results in improvement of impact resistance as well as vibration resistance of the crystal resonator device.

In this case, it is preferable that the crystal resonator is supported by the inner wall of the package at four corner regions of the crystal resonator.

With the above-described configuration, by adopting four point support as the supporting manner of the crystal resonator by the package, it is possible to further improve impact resistance and vibration resistance of the crystal resonator device.

Also in this case, it is preferable that the crystal resonator is supported by the inner wall of the package via a conductive adhesive, and that the conductive adhesive is arranged so as to extend from a bottom surface of the crystal resonator to reach a top surface of the crystal resonator via a side surface of the crystal resonator.

With the above-described configuration, by using the conductive adhesive, the crystal resonator can be further stably supported by the package, which results in improvement of impact resistance as well as vibration resistance of the crystal resonator device.

In the above-configured crystal resonator device here, the crystal resonator, and a sensor element or a circuit element constituting an oscillation circuit may be housed and hermetically sealed in the same space provided in the package. Also, the crystal resonator may be housed and hermetically sealed in a first recess part formed in a first main surface of the package while the sensor element or the circuit element constituting an oscillation circuit may be housed in a second recess part formed in a second main surface of the package. In this configuration in which the crystal resonator is housed in the first recess part formed in the first main surface of the package while the circuit element is housed in the second recess part formed in the second main surface of the package, heat and/or electromagnetic waves emitted from the circuit element can be insulated or reduced by the package. Thus, it is possible to prevent the vibrating part of the crystal resonator from being affected by the heat and/or electromagnetic waves emitted from the circuit element.

In the above-configured crystal resonator device, it is preferable that a package body of the package that houses the crystal resonator is made of ceramic.

With the above-described configuration, since the thermal conductivity of the crystal resonator plate of the crystal resonator is smaller than the thermal conductivity of the package body of the package, it is possible to prevent rapid change in the temperature of the vibrating part of the crystal resonator plate, which also leads to reduction in characteristic variations of the crystal resonator device caused by the change in the external temperature.

Effect of the Invention

With the crystal resonator device including a crystal resonator with a sandwich structure of the present invention, even when the external environment (such as the temperature and the atmospheric pressure) changes, the characteristic variations of the crystal resonator device are reduced, and thus the crystal resonator device obtains a high reliability.

MEANS FOR CARRYING OUT THE INVENTION

Hereinafter, an embodiment of the present invention will be described with reference to the drawings, where a crystal oscillator is exemplarily shown as a crystal resonator device.

Figure 1:
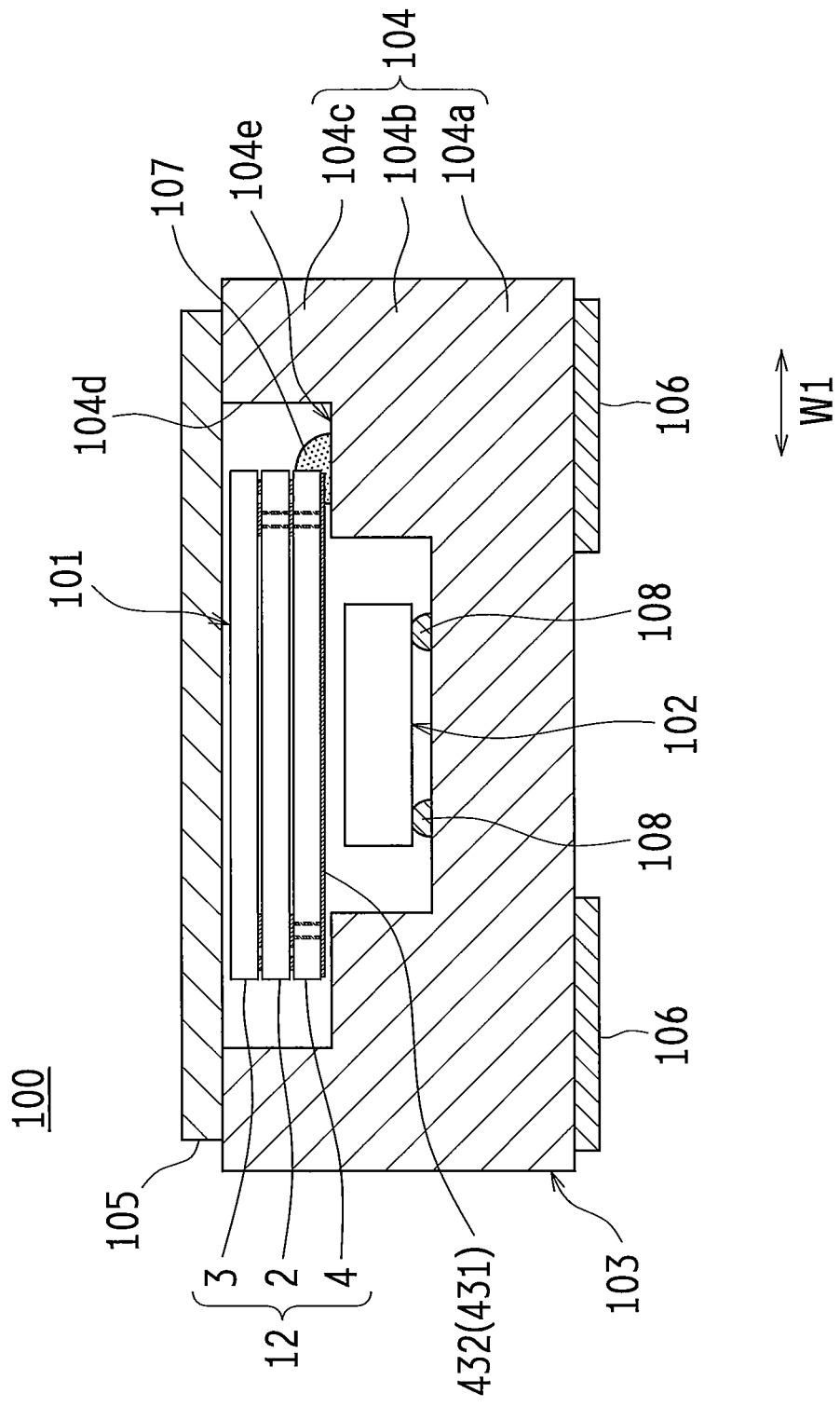
FIG. 1 is a schematic configuration diagram illustrating a crystal oscillator according to an embodiment.

As shown in FIG. 1, a crystal oscillator 100 according to this embodiment includes: a crystal resonator 101 having a crystal resonator plate 2 that piezoelectrically vibrates; an IC chip (integrated circuit element) 102 that constitutes an oscillation circuit together with the crystal resonator 101; and a package 103 that houses the crystal resonator 101 and the IC chip 102.

The package 103 includes: a package body 104 having a recess part 104d so as to house the crystal resonator 101 and the IC chip 102; and a lid 105 that hermetically seals the crystal resonator 101 and the IC chip 102 housed in the package body 104.

The package body 104 is made, for example, of an insulating material such as ceramic. The package body 104 includes: a bottom wall part 104a; a first side wall part 104b formed on a periphery of the bottom wall part 104a; and a second side wall part 104c formed on a periphery of the first side wall part 104b. The bottom wall part 104a, the first side wall part 104b and the second side wall part 104c are integrally formed by, for example, sintering three layers of ceramic substrates laminated on each other. The package body 104 may also be formed by a ceramic substrate as a single layer, or by four or more layers of ceramic substrates.

In the package body 104, the recess part 104d whose top surface is opened is made up of the bottom wall part 104a, the first side wall part 104*b* and the second side wall part 104*c*. Also, a step part 104*e* having an annular shape in plan view is made up of the first side wall part 104*b* and the second side wall part 104*c*.

In the recess part 104*d* of the package body 104, the crystal resonator 101 and the IC chip 102 are housed. The crystal resonator 101 is mounted and supported on the step part 104*e* (top surface of the first side wall part 104*b*) of the package body 104 in a state of a cantilever. The IC chip 102 is mounted on a bottom surface (top surface of the bottom wall part 104*a*) of the package body 104. On the bottom surface of the package body 104, a plurality of external connection terminals 106 is formed. To the top surface of the package body 104 (top surface of the second side wall part 104*c*), the lid 105 as a flat plate is integrally attached via a metallic seam ring or a brazing material as a sealing member not shown. Thus, the package 103 is formed so as to have a substantially rectangular parallelepiped shape, and furthermore, the crystal resonator 101 and the IC chip 102 housed in the recess part 104*d* are hermetically sealed. The inside of the package 103 is in a decompressed state compared to the atmospheric pressure, that is, for example, it is in a vacuum state (with the pressure of 100 Pa or less). The lid 105 may have a shape of a cap that has a wall part on a periphery of the flat plate member. Also, in place of decompression of the inside of the package 103 to the vacuum state, the inside of the package 103 may be maintained in the state of inert atmosphere by filling the package 103 with inert gas.

As described later, the crystal resonator 101 is formed so as to have a substantially rectangular shape in plan view (see FIGS. 2 to 8). The crystal resonator 101 is supported by the step part 104*e* of the package body 104 only at one end of the crystal resonator 101 in the long side direction in plan view. The other end of the crystal resonator 101 in the long side direction is disposed so as to be spaced apart from the step part 104*e* of the package body 104. A pair of external electrode terminals 431 and 432 (see FIG. 8) is formed on the bottom surface of the crystal resonator 101 so as to be connected, respectively, to a pair of electrode pads (not shown) formed on the step part 104*e* of the package body 104, each via a conductive adhesive 107. The pair of electrode pads is arranged along the direction orthogonal to the W1 direction in FIG. 1. In this case, the pair of electrode pads is disposed respectively on the front side and the rear side in the direction orthogonal to the W1 direction in FIG. 1 at a predetermined interval. Furthermore, the pair of electrode pads is disposed only on one end of the step part 104*e* in the W1 direction of FIG. 1, and not disposed at the other end of the step part 104*e* in the W1 direction.

The IC chip 102 is connected to a wiring pattern (not shown) formed on the bottom surface of the package body 104 by, for example, flip chip bonding via a plurality of bumps 108. The IC chip 102 is connected, via the wiring (not shown), to the pair of electrode pads formed on the step part 104*e* of the package body 104 and to the plurality of external connection terminals 106 formed on the bottom surface of the package body 104. The IC chip 102 may be mounted on the package body 104 by wire bonding.

Here, the crystal resonator 101 included in the crystal oscillator 100 is described with reference to FIGS. 2 to 8.

As shown in FIGS. 2 to 8, the crystal resonator 101 includes: the crystal resonator plate 2; a first sealing member 3 that covers a first excitation electrode 221 formed on a first main surface 211 of the crystal resonator plate 2 and that hermetically seals the first excitation electrode 221; and a second sealing member 4 that covers a second excitation electrode 222 formed on a second main surface 212 of the crystal resonator plate 2 so as to make a pair with the first excitation electrode 221 and that hermetically seals the second excitation electrode 222. In the crystal resonator 101, the crystal resonator plate 2 is bonded to the first sealing member 3, and also the crystal resonator plate 2 is bonded to the second sealing member 4. Thus, a resonator package 12 having a sandwich structure is constituted.

An internal space 13 of the resonator package 12 is formed by bonding the first sealing member 3 to the second sealing member 4 via the crystal resonator plate 2. In this internal space 13 of the resonator package 12, a vibrating part 22 is hermetically sealed. The vibrating part 22 includes the first excitation electrode 221 and the second excitation electrode 222 respectively formed on both main surfaces 211 and 212 of the crystal resonator plate 2. The inside of the resonator package 12 has a degree of vacuum higher than that of the inside of the package 103 described above, that is, it is in a high vacuum state (with the pressure of approximately 0.1 mPa). The resonator package 12 has, for example, a package size of 1.0×0.8 mm, which is reduced in size and height. According to the size reduction, no castellation is formed in the resonator package 12. Through holes (first to third through holes) are used for conduction between electrodes.

The configuration of the crystal resonator 101 is described. Here, each of the crystal resonator plate 2, the first sealing member 3 and the second sealing member 4 is described as a single body without being bonded.

Figure 5:
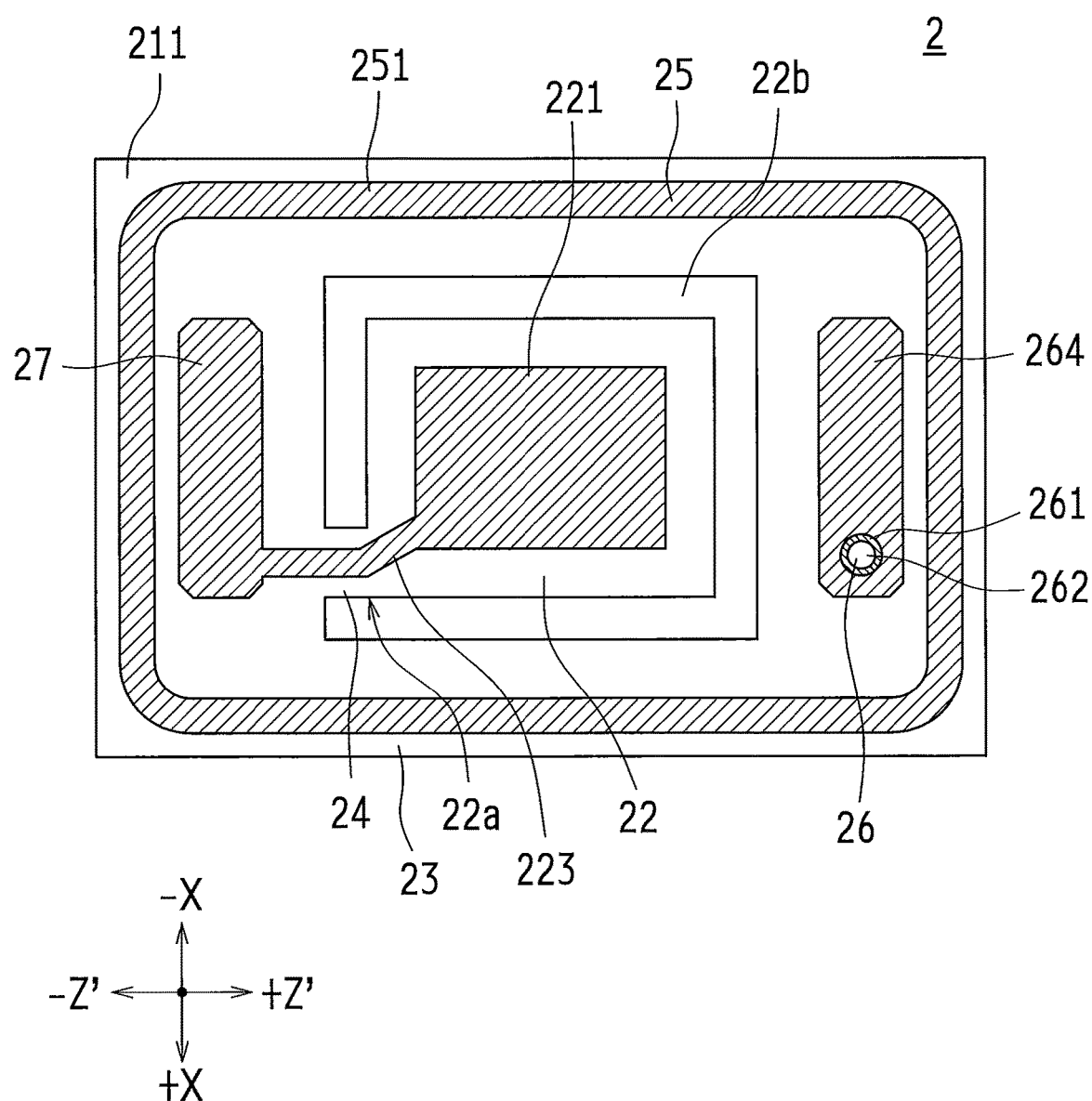
FIG. 5 is a schematic plan view illustrating a crystal resonator plate of the crystal resonator of FIG. 2.
Figure 6:
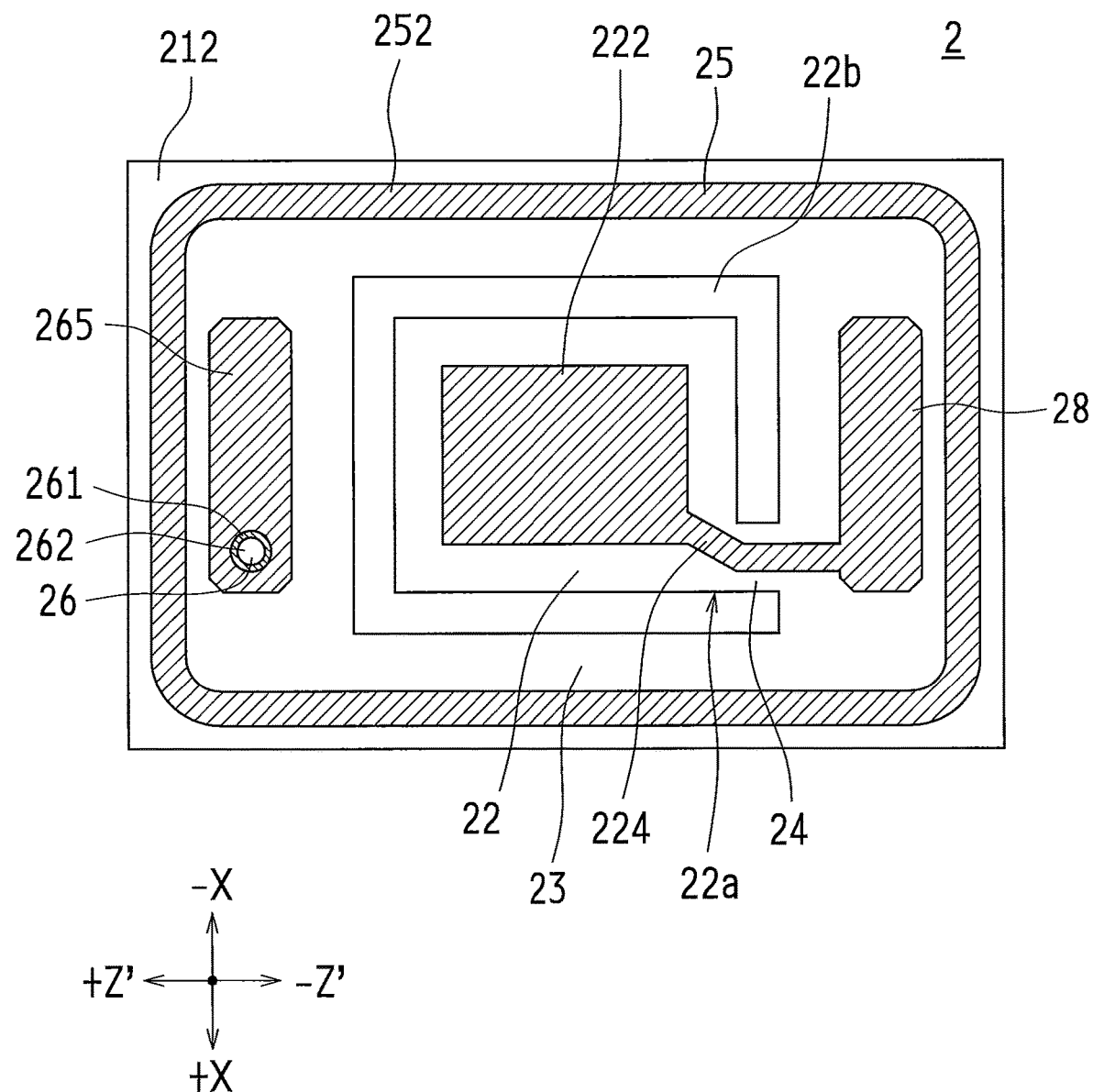
FIG. 6 is a schematic rear view illustrating the crystal resonator plate of the crystal resonator of FIG. 2.

As shown in FIGS. 5 and 6, the crystal resonator plate 2 is made of a crystal as a piezoelectric material. Both main surfaces (the first main surface 211 and the second main surface 212) are formed as smooth flat surfaces (mirror-finished). Here, an AT-cut crystal resonator plate that causes thickness shear vibration is used as the crystal resonator plate 2.

In the crystal resonator plate 2 shown in FIGS. 5 and 6, both main surfaces 211 and 212 of the crystal resonator plate 2 are an XZ' plane. On this XZ' plane, a direction in parallel with the lateral direction (short side direction) of the crystal resonator plate 2 is the X axis direction, and a direction in parallel with the longitudinal direction (long side direction) of the crystal resonator plate 2 is the Z' axis direction. The AT-cut method is a processing method in which a crystal plate is cut out of synthetic quartz crystal at an angle tilted by 35° 15' about an X axis from a Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the direction in which the AT-cut crystal is cut out. In a state in which the crystal resonator 101 is mounted on the package 103 of the crystal oscillator 100, the Z' axis direction equals the W1 direction in FIG. 1.

The pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a connecting (holding) part 24 that connects the vibrating part 22 to the external frame part 23. The vibrating part 22, the connecting part 24 and the external frame part 23 are integrally formed. The connecting part 24 is provided only at one position between the vibrating part 22 and the external frame part 23, and the remaining part between the vibrating part 22 and the external frame part 23 on which the connecting part 24 is not provided is made as a space (clearance) 22b. Although it is not shown in the drawings, the vibrating part 22 and the connecting part 24 are formed so as to have the thickness thinner than the external frame part 23. Due to the difference in the thickness between the external frame part 23 and the connecting part 24, the natural frequency of piezoelectric vibration differs between the external frame part 23 and the connecting part 24. Thus, the external frame part 23 is not likely to resonate with the piezoelectric vibration of the connecting part 24.

The connecting part 24 extends (protrudes) only from one corner part 22a positioned in the +X direction and in the −Z' direction of the vibrating part 22 to the external frame part 23 in the −Z' direction. Thus, since the connecting part 24 is disposed on the corner part 22a where displacement of the piezoelectric vibration is relatively small in the outer periphery edge part of the vibrating part 22, it is possible to prevent leakage of the piezoelectric vibration to the external frame part 23 via the connecting part 24 compared to the case in which the connecting part 24 is provided on the position other than the corner part 22a (i.e. central part of the respective sides), which makes the vibrating part 22 piezoelectrically vibrate more effectively. Furthermore, compared to the configuration in which two or more connecting parts 24 are disposed, it is possible to reduce a stress applied to the vibrating part 22, which results in reduction in frequency shift of the piezoelectric vibration due to the stress. Thus, stability of the piezoelectric vibration can be improved.

The first excitation electrode 221 is provided on the first main surface of the vibrating part 22 while the second excitation electrode 222 is provided on the second main surface of the vibrating part 22. A first extraction electrode 223 and a second extraction electrode 224, which are connected to the external electrode terminals 431 and 432, are respectively connected to the first excitation electrode 221 and the second excitation electrode 222. The first extraction electrode 223 is drawn from the first excitation electrode 221 and connected to a connection bonding pattern 27 formed on the external frame part 23 via the connecting part 24. The second extraction electrode 224 is drawn from the second excitation electrode 222 and connected to a connection bonding pattern 28 formed on the external frame part 23 via the connecting part 24. Accordingly, the first extraction electrode 223 is formed on the first main surface of the connecting part 24, and the second extraction electrode 224 is formed on the second main surface of the connecting part 24. The first excitation electrode 221 and the first extraction electrode 223 are constituted of a base PVD film deposited on the first main surface 211 by physical vapor deposition, and an electrode PVD film deposited on the base PVD film by the physical vapor deposition. The second excitation electrode 222 and the second extraction electrode 224 are constituted of a base PVD film deposited on the second main surface 212 by the physical vapor deposition, and an electrode PVD film deposited on the base PVD film by the physical vapor deposition.

Resonator-plate-side sealing parts 25 for bonding the crystal resonator plate 2 respectively to the first sealing member 3 and the second sealing member 4 are provided on the respective main surfaces 211 and 212 of the crystal resonator plate 2. On the resonator-plate-side sealing part 25 on the first main surface 211 of the crystal resonator plate 2, a resonator-plate-side first bonding pattern 251 is formed to be bonded to the first sealing member 3. Also, on the resonator-plate-side sealing part 25 on the second main surface 212 of the crystal resonator plate 2, a resonator-plate-side second bonding pattern 252 is formed to be bonded to the second sealing member 4. The resonator-plate-side first bonding pattern 251 and the resonator-plate-side second bonding pattern 252 are each formed on the external frame part 23 so as to have an annular shape in plan view. Also, respective outer edges and inner edges of the resonator-plate-side first bonding pattern 251 and the resonator-plate-side second bonding pattern 252 are each formed so as to have a substantially rectangular shape. The resonator-plate-side first bonding pattern 251 and the resonator-plate-side second bonding pattern 252 are disposed on the respective main surfaces 211 and 212 of the crystal resonator plate 2 so as to be close to the outer peripheral edge of the main surfaces 211 and 212. The pair of first excitation electrode 221 and second excitation electrode 222 of the crystal resonator plate 2 is not electrically connected to the resonator-plate-side first bonding pattern 251 and the resonator-plate-side second bonding pattern 252.

The resonator-plate-side first bonding pattern 251 is constituted of a base PVD film deposited on the first main surface 211 by the physical vapor deposition, and an electrode PVD film deposited on the base PVD film by the physical vapor deposition. The resonator-plate-side second bonding pattern 252 is constituted of a base PVD film deposited on the second main surface 212 by the physical vapor deposition, and an electrode PVD film deposited on the base PVD film by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of each main surface 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films are made of a single material (Ti or Cr), the electrode PVD films are made of a single material (Au), and the electrode PVD films have a thickness greater than the thickness of the base PVD films. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration. In this case, it is possible to form collectively the first excitation electrode 221, the first extraction electrode 223 and the resonator-plate-side first bonding pattern 251 in the same process. Similarly to the above, the second excitation electrode 222, the second extraction electrode 224 and the resonator-plate-side second bonding pattern 252 can have the same configuration. In this case, it is possible to form collectively the second excitation electrode 222, the second extraction elec-trode 224 and the resonator-plate-side second bonding pattern 252 in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 5 and 6, a through hole (first through hole 26) is formed in the crystal resonator plate 2 so as to penetrate between the first main surface 211 and the second main surface 212. The first through hole 26 is disposed in the external frame part 23 of the crystal resonator plate 2. The first through hole 26 is connected to a connection bonding pattern 453 of the second sealing member 4.

Figure 2:
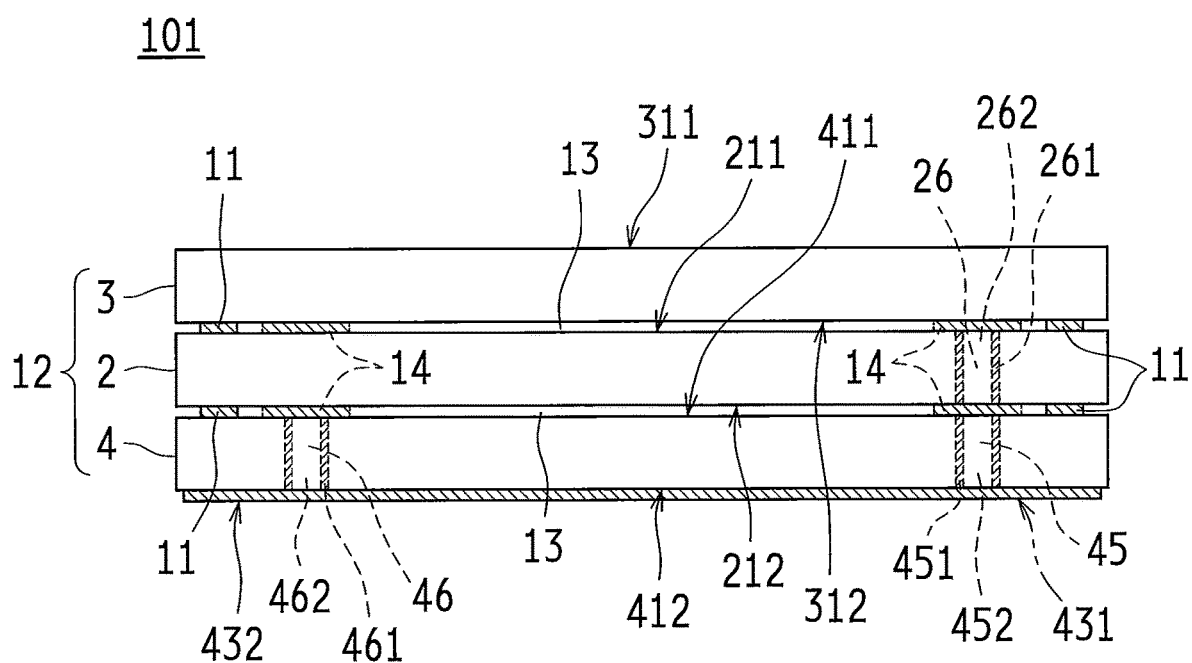
FIG. 2 is a schematic configuration diagram illustrating a crystal resonator included in the crystal oscillator of FIG. 1.

In the first through hole 26, a through electrode 261 is formed along an inner wall surface of the first through hole 26 so as to establish conduction between the electrodes formed on the first main surface 211 and the second main surface 212, as shown in FIGS. 2, 5 and 6. A central part of the first through hole 26 is a hollow through part 262 penetrating between the first main surface 211 and the second main surface 212. Connection bonding patterns 264 and 265 are formed on respective outer peripheries of the first through hole 26. The connection bonding patterns 264 and 265 are formed respectively on the main surfaces 211 and 212 of the crystal resonator plate 2.

The connection bonding pattern 264 of the first through hole 26 formed on the first main surface 211 of the crystal resonator plate 2 extends on the external frame part 23 in the X axis direction. The connection bonding pattern 27 is formed on the first main surface 211 of the crystal resonator plate 2 so as to be connected to the first extraction electrode 223. The connection bonding pattern 27 also extends on the external frame part 23 in the X axis direction. The connection bonding pattern 27 is formed on the side opposite to the connection bonding pattern 264 in the Z' axis direction with the vibrating part 22 (the first excitation electrode 221) being interposed therebetween. That is, the connection bonding patterns 27 and 264 are formed respectively on both sides of the vibrating part 22 in the Z' axis direction.

Similarly to the above, the connection bonding pattern 265 of the first through hole 26 formed on the second main surface 212 of the crystal resonator plate 2 extends on the external frame part 23 in the X axis direction. The connection bonding pattern 28 is formed on the second main surface 212 of the crystal resonator plate 2 so as to be connected to the second extraction electrode 224. The connection bonding pattern 28 also extends on the external frame part 23 in the X axis direction. The connection bonding pattern 28 is formed on the side opposite to the connection bonding pattern 265 in the Z' axis direction with the vibrating part 22 (the second excitation electrode 222) being interposed therebetween. That is, the connection bonding patterns 28 and 265 are formed respectively on both sides of the vibrating part 22 in the Z' axis direction.

The connection bonding patterns 27, 28, 264 and 265 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each connection bonding pattern 27, 28, 264 and 265 is constituted of a base PVD film deposited on each main surface (the first main surface 211 and the second main surface 212) of the crystal resonator plate 2 by the physical vapor deposition, and an electrode PVD film deposited on the base PVD film by the physical vapor deposition.

In the crystal resonator 101, the first through hole 26 and the connection bonding patterns 27, 28, 264 and 265 are formed in the inward position of the internal space 13 (inside of respective inner peripheral surfaces of bonding materials 11) in plan view. The internal space 13 is formed in the inward position (inside) of the resonator-plate-side first bonding pattern 251 and the resonator-plate-side second bonding pattern 252 in plan view. Here, the inward position of the internal space 13 means strictly the inner side of the respective inner peripheral surfaces of the bonding materials 11 (described later), not including the positions on the bonding materials 11. The first through hole 26 and the connection bonding patterns 27, 28, 264 and 265 are not electrically connected to the resonator-plate-side first bonding pattern 251 and the resonator-plate-side second bonding pattern 252.

Figure 3:
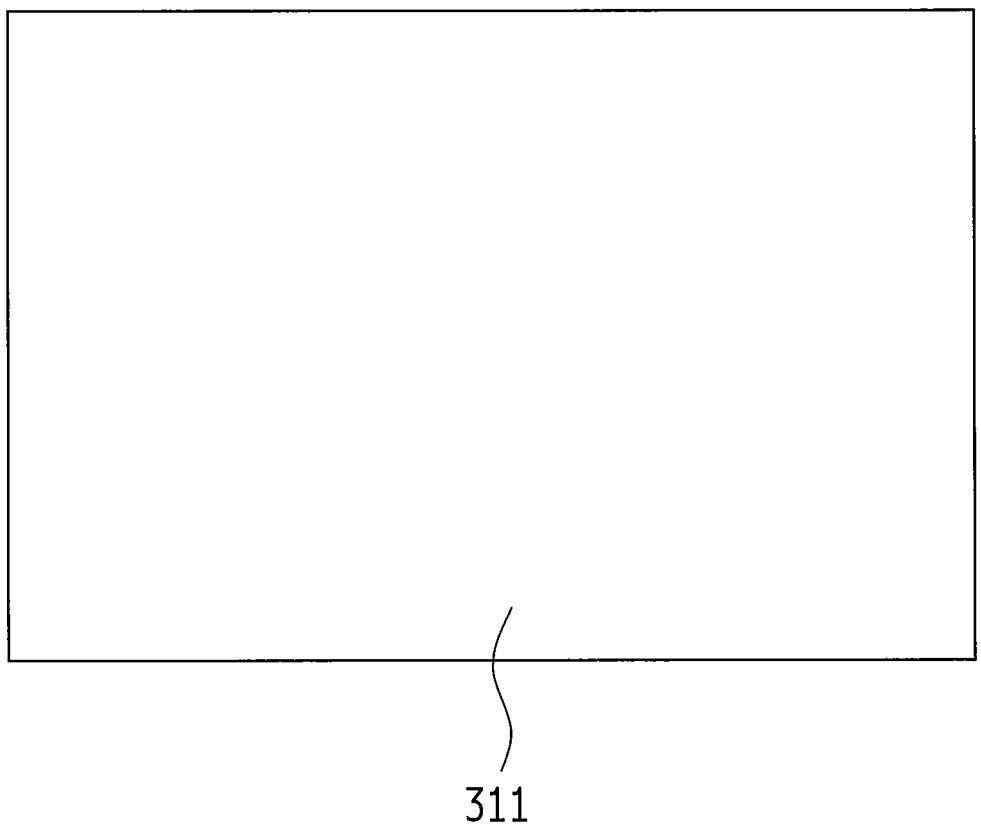
FIG. 3 is a schematic plan view illustrating a first sealing member of the crystal resonator of FIG. 2.
Figure 4:
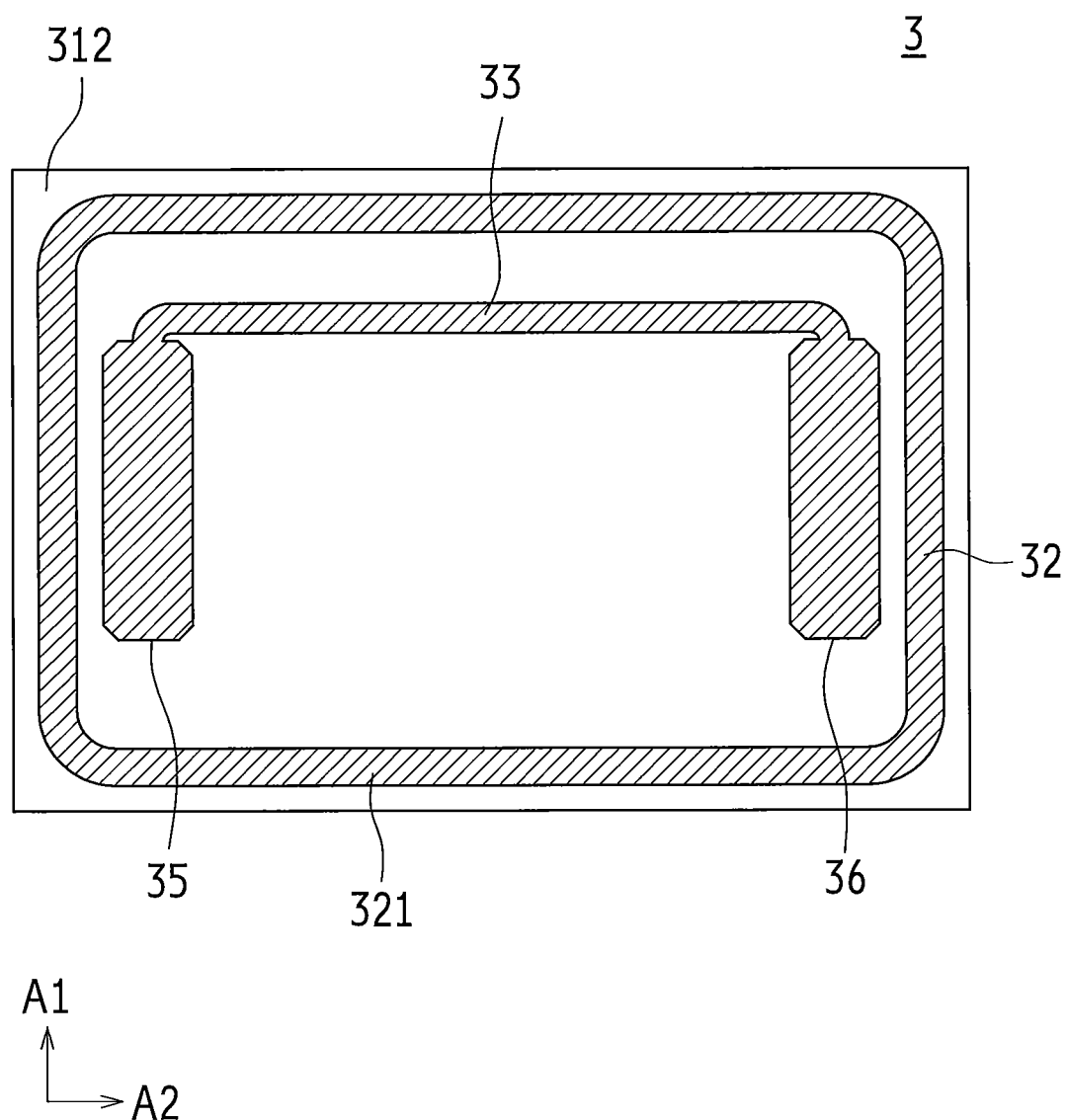
FIG. 4 is a schematic rear view illustrating the first sealing member of the crystal resonator of FIG. 2.

The first sealing member 3 is made of a material having the flexural rigidity (moment of inertia of area×Young's modulus) of not more than 1000 [N·mm$^2$]. Specifically, as shown in FIGS. 3 and 4, the first sealing member 3 is a substrate having a substantially rectangular parallelepiped shape that is made of crystal. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. A sealing-member-side first bonding pattern 321 is formed on the sealing-member side first sealing part 32 so as to be bonded to the crystal resonator plate 2. The sealing-member-side first bonding pattern 321 is formed so as to have an annular shape in plan view. Also, an outer edge and an inner edge of the sealing-member-side first bonding pattern 321 are each formed so as to have a substantially rectangular shape. The sealing-member-side first bonding pattern 321 is disposed so as to be close to the outer peripheral edge of the second main surface 312 of the first sealing member 3. The sealing-member-side first bonding pattern 321 has the same width at all positions on the sealing-member-side first sealing part 32 of the first sealing member 3.

The sealing-member-side first bonding pattern 321 is constituted of a base PVD film deposited on the first sealing member 3 by the physical vapor deposition, and an electrode PVD film deposited on the base PVD film by the physical vapor deposition. The base PVD film is made of Ti (or Cr), and the electrode PVD film is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side.

On the second main surface 312 (i.e. the surface facing the crystal resonator plate 2) of the sealing member 3, connection bonding patterns 35 and 36 are formed so as to be bonded, respectively, to the connection bonding patterns 264 and 27 of the crystal resonator plate 2. The connection bonding patterns 35 and 36 extend in the short side direction (in the A1 direction in FIG. 4) of the first sealing member 3. The connection bonding patterns 35 and 36 are provided at a predetermined interval in the long side direction (in the A2 direction in FIG. 4) of the first sealing member 3. The interval between the connection bonding patterns 35 and 36 in the A2 direction is substantially the same as the interval between the connection bonding patterns 264 and 27 in the Z' direction of the crystal resonator plate 2 (see FIG. 5). The connection bonding patterns 35 and 36 are connected to each other via a wiring pattern 33. The wiring pattern 33 is disposed between the connection bonding patterns 35 and 36. The wiring pattern 33 extends in the A2 direction. The wiring pattern 33 is not bonded to the connection bonding patterns 264 and 27 of the crystal resonator plate 2.

The connection bonding patterns 35 and 36, and the wiring pattern 33 have the same configuration as the sealing-member-side first bonding pattern 321, accordingly, they can be formed by the same process as that for the sealing-member-side first bonding pattern 321. Specifically, each of the connection bonding patterns 35 and 36 and the wiring pattern 33 is constituted of a base PVD film deposited on the second main surface 312 of the first sealing member 3 by the physical vapor deposition, and an electrode PVD film deposited on the base PVD film by the physical vapor deposition.

In the crystal resonator 101, the connection bonding patterns 35 and 36, and the wiring pattern 33 are formed in the inward position of the internal space 13 (inside of the respective inner peripheral surfaces of the bonding materials 11) in plan view. The connection bonding patterns 35 and 36, and the wiring pattern 33 are not electrically connected to the sealing-member-side first bonding pattern 321. In the crystal resonator 101, the A1 direction in FIG. 4 equals the X axis direction in FIG. 5, and the A2 direction in FIG. 4 equals the Z' axis direction in FIG. 5.

Figure 7:
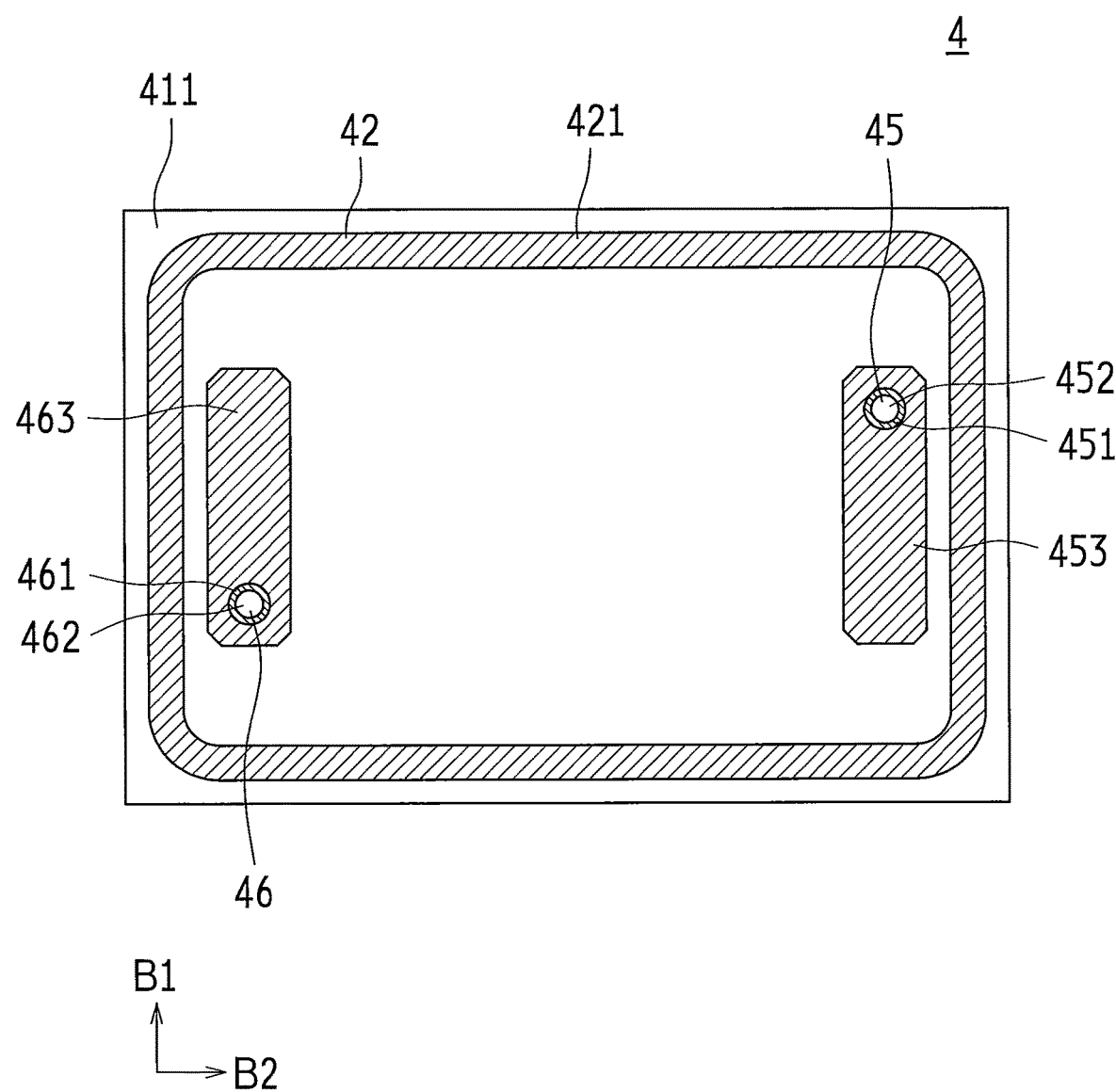
FIG. 7 is a schematic plan view illustrating a second sealing member of the crystal resonator of FIG. 2.
Figure 8:
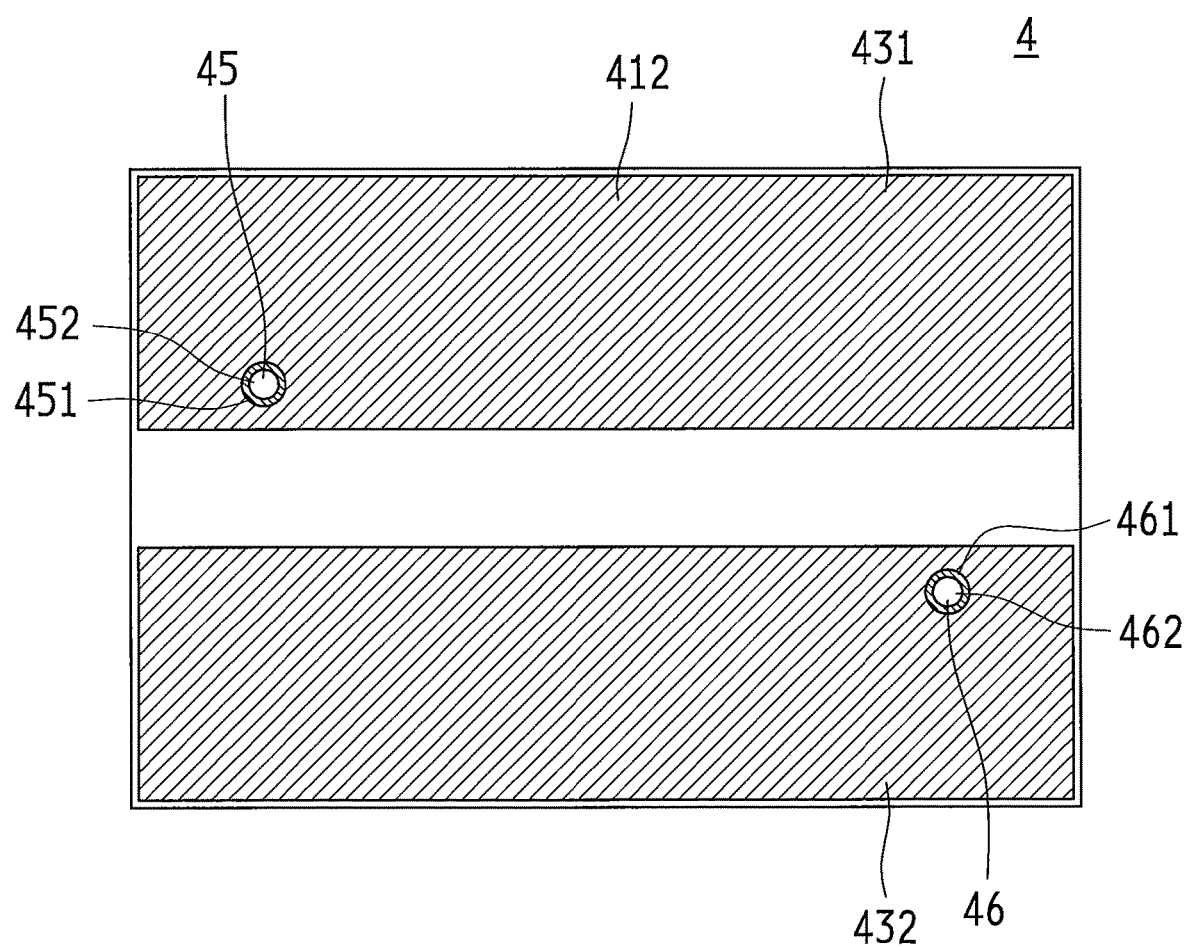
FIG. 8 is a schematic rear view illustrating the second sealing member of the crystal resonator of FIG. 2.

The second sealing member 4 is made of a material having the flexural rigidity (moment of inertia of area× Young's modulus) of not more than 1000 [N·mm$^2$]. Specifically, as shown in FIGS. 7 and 8, the second sealing member 4 is a substrate having a substantially rectangular parallelepiped shape that is made of crystal. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. On the sealing-member-side second sealing part 42, a sealing-member-side second bonding pattern 421 is formed so as to be bonded to the crystal resonator plate 2. The sealing-member-side second bonding pattern 421 is formed so as to have an annular shape in plan view. Also, an outer edge and an inner edge of the sealing-member-side second bonding pattern 421 are each formed so as to have a substantially rectangular shape. The sealing-member-side second bonding pattern 421 is disposed so as to be close to the outer peripheral edge of the first main surface 411 of the second sealing member 4. The sealing-member-side second bonding pattern 421 has the same width at all positions on the sealing-member-side second sealing part 42 of the second sealing member 4.

The sealing-member-side second bonding pattern 421 is constituted of a base PVD film deposited on the second sealing member 4 by the physical vapor deposition, and an electrode PVD film deposited on the base PVD film by the physical vapor deposition. The base PVD film is made of Ti (or Cr), and the electrode PVD film is made of Au. Also, the sealing-member-side second bonding pattern 421 does not contain Sn. Specifically, the sealing-member-side second bonding pattern 421 is made of a plurality of layers laminated on the sealing-member-side second sealing part 42 of a second main surface 412, that is, a Ti layer (or a Cr layer) and an Au layer are deposited by the vapor deposition in this order from the lowermost layer side.

Also, the pair of external electrode terminals 431 and 432, which is electrically connected to the outside, is formed on the second main surface 412 (the outer main surface not facing the crystal resonator plate 2) of the second sealing member 4. As shown in FIG. 8, the pair of external electrode terminals 431 and 432 is respectively disposed so as to extend on the second main surface 412 of the second sealing member 4 in the long side direction in plan view. Each of the pair of external electrode terminals 431 and 432 is constituted of a base PVD film deposited on the second main surface 412 by the physical vapor deposition, and an electrode PVD film deposited on the base PVD film by the physical vapor deposition.

As shown in FIGS. 2, 7 and 8, two through holes (a second through hole 45 and a third through hole 46) are formed in the second sealing member 4 so as to penetrate between the first main surface 411 and the second main surface 412. The second through hole 45 is connected to the external electrode terminal 431 and to the connection bonding pattern 265 of the crystal resonator plate 2. The third through hole 46 is connected to the external electrode terminal 432 and to the connection bonding pattern 28 of the crystal resonator plate 2.

In the second through hole 45 and the third through hole 46, through electrodes 451 and 461 are respectively formed along inner wall surfaces of the second through hole 45 and the third through hole 46 so as to establish conduction between the electrodes formed on the first main surface 411 and the second main surface 412, as shown in FIGS. 2, 7 and 8. Respective central parts of the second through hole 45 and the third through hole 46 are hollow through parts 452 and 462 penetrating between the first main surface 411 and the second main surface 412. The connection bonding pattern 453 and a connection bonding pattern 463 are formed respectively on the outer peripheries of the second through hole 45 and the third through hole 46.

The connection bonding patterns 453 and 463 are provided on the first main surface 411 of the second sealing member 4 so as to be bonded, respectively, to the connection bonding patterns 265 and 28 of the crystal resonator plate 2. The connection bonding patterns 453 and 463 extend in the short side direction (in the B1 direction in FIG. 7) of the second sealing member 4. The connection bonding patterns 453 and 463 are provided at a predetermined interval in the long side direction (in the B2 direction in FIG. 7) of the second sealing member 4. The interval between the connection bonding patterns 453 and 463 in the B2 direction is substantially the same as the interval between the connection bonding patterns 265 and 28 in the Z' axis direction of the crystal resonator plate 2 (see FIG. 6).

The connection bonding patterns 453 and 463 have the same configuration as the sealing-member-side second bonding pattern 421, accordingly, they can be formed by the same process as that for the sealing-member-side second bonding pattern 421. Specifically, each of the connection bonding patterns 453 and 463 is constituted of a base PVD film deposited on the first main surface 411 of the second sealing member 4 by the physical vapor deposition, and an electrode PVD film deposited on the base PVD film by the physical vapor deposition.

In the crystal resonator 101, the second through hole 45, the third through hole 46, and the connection bonding patterns 453 and 463 are formed in the inward position of the internal space 13 in plan view. The second through hole 45, the third through hole 46, and the connection bonding patterns 453 and 463 are not electrically connected to the sealing-member-side second bonding pattern 421. Also, the external electrode terminals 431 and 432 are not electrically connected to the sealing-member-side second bonding pattern 421. In the crystal resonator 101, the B1 direction in FIG. 7 equals the X axis direction in FIG. 6, and the B2 direction in FIG. 7 equals the Z' axis direction in FIG. 6.

In the crystal resonator 101 including the above-described crystal resonator plate 2, the first sealing member 3 and the second sealing member 4, the crystal resonator plate 2 and the first sealing member 3 are subjected to diffusion bonding in a state in which the resonator-plate-side first bonding pattern 251 and the sealing-member-side first bonding pattern 321 are superimposed on each other, and the crystal resonator plate 2 and the second sealing member 4 are subjected to the diffusion bonding in a state in which the resonator-plate-side second bonding pattern 252 and the sealing-member-side second bonding pattern 421 are superimposed on each other, thus, the resonator package 12 having the sandwich structure as shown in FIG. 2 is produced. In contrast to the conventional art, no special bonding material, such as an adhesive, is needed separately. Thus, the internal space 13 of the resonator package 12, i.e. the space for housing the vibrating part 22 is hermetically sealed.

Then, the resonator-plate-side first bonding pattern 251 and the sealing-member-side first bonding pattern 321 themselves serve as the bonding material 11 formed upon the diffusion bonding. The crystal resonator plate 2 and the first sealing member 3 are bonded to each other by this bonding material 11. The resonator-plate-side second bonding pattern 252 and the sealing-member-side second bonding pattern 421 themselves serve as the bonding material 11 formed upon the diffusion bonding. The crystal resonator plate 2 and the second sealing member 4 are bonded to each other by this bonding material 11. The respective bonding materials 11 are formed so as to have an annular shape in plan view. Also, respective outer edges and inner edges of the bonding materials 11 are each formed so as to have a substantially rectangular shape. The respective bonding materials 11 are disposed at positions substantially matching with each other in plan view. More specifically, the respective inner peripheral edges of the bonding materials 11 are disposed at positions substantially matching with each other while the respective outer peripheral edges of the bonding materials 11 are disposed at positions substantially matching with each other. It is possible to enhance the bonding strength of the bonding materials 11 by bonding the respective bonding patterns in a pressurized state.

Here, all the wirings from the first and the second excitation electrodes 221 and 222 of the crystal resonator plate 2 to the external electrode terminals 431 and 432 are formed inside bonding materials 11a and 11b as the sealing parts in plan view. The respective outer edges and inner edges of the bonding materials 11 are each formed so as to have a substantially rectangular shape in plan view. The bonding materials 11 are formed so as to be close to the outer peripheral edge of the resonator package 12 in plan view. In this way, it is possible to increase the size of the vibrating part 22 of the crystal resonator plate 2. Regarding the distance between the inner peripheral edges of the bonding materials 11 and the space 22b between the vibrating part 22 and the external frame part 23, the distance in the short side direction of the resonator package 12 is larger than the distance in the long side direction.

At this time, the respective connection bonding patterns as described above are also subjected to the diffusion bonding in a state in which they are superimposed on each other. Specifically, the connection bonding pattern 264 of the crystal resonator plate 2 and the connection bonding pattern 35 of the first sealing member 3 are subjected to the diffusion bonding. The connection bonding pattern 27 of the crystal resonator plate 2 and the connection bonding pattern 36 of the first sealing member 3 are subjected to the diffusion bonding. The connection bonding pattern 265 of the crystal resonator plate 2 and the connection bonding pattern 453 of the second sealing member 4 are subjected to the diffusion bonding. The connection bonding pattern 28 of the crystal resonator plate 2 and the connection bonding pattern 463 of the second sealing member 4 are subjected to the diffusion bonding.

Then, the connection bonding pattern 264 and the connection bonding pattern 35 themselves serve as the bonding material 14 formed upon the diffusion bonding. The crystal resonator plate 2 and the first sealing member 3 are bonded to each other by this bonding material 14. The connection bonding pattern 27 and the connection bonding pattern 36 themselves serve as the bonding material 14 formed upon the diffusion bonding. The crystal resonator plate 2 and the first sealing member 3 are bonded to each other by this bonding material 14. The connection bonding pattern 265 and the connection bonding pattern 453 themselves serve as the bonding material 14 formed upon the diffusion bonding. The crystal resonator plate 2 and the second sealing member 4 are bonded to each other by this bonding material 14. The connection bonding pattern 28 and the connection bonding pattern 463 themselves serve as the bonding material 14 formed upon the diffusion bonding. The crystal resonator plate 2 and the second sealing member 4 are bonded to each other by this bonding material 14. These bonding materials 14 serve to establish conduction between the through electrodes of the through holes and the bonding materials 14, and to hermetically seal the bonding parts. Since the bonding materials 14 are formed inside the bonding materials 11 as the sealing parts in plan view, they are shown by the broken line in FIG. 2. On the other hand, the wiring pattern 33 does not become the bonding material 14 since it is not bonded to the connection bonding patterns 264 and 27 of the crystal resonator plate 2. Thus, the wiring pattern 33 remains on the second main surface 312 of the first sealing member 3 as the wiring.

In the resonator package 12 having the sandwich structure produced as described above, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11a between the first sealing member 3 and the crystal resonator plate 2 is not more than 1.00 μm, and the thickness of the bonding material 11b between the second sealing member 4 and the crystal resonator plate 2 is not more than 1.00 μm (specifically, the thickness in the Au—Au bonding is 0.15 to 1.00 μm). As a comparative example, the conventional metal paste sealing material containing Sn has a thickness of 5 to 20 μm.

The crystal oscillator 100 according to this embodiment includes the crystal resonator 101 having the sandwich structure configured as described above. Since the crystal resonator 101 having the sandwich structure can be adaptable to miniaturization and height reduction (thickness reduction), the crystal oscillator 100 according to this embodiment can also be adaptable to miniaturization and height reduction.

In the crystal oscillator 100 in this embodiment, the crystal resonator 101 having the sandwich structure and the IC chip 102 are hermetically sealed in the package 103. Thus, it is possible to minimize the influence on the vibrating part 22 of the crystal resonator 101 caused by changes in the external environment (for example, the temperature and the atmospheric pressure) by doubly hermetically sealing the vibrating part 22 of the crystal resonator 101. Accordingly, even when the external environment changes, it is possible to reduce variations of the oscillation characteristic of the crystal oscillator 100, and also to prevent generation of noise components in the oscillation characteristic of the crystal oscillator 100. Therefore, it is possible to meet the requirements of miniaturization and height reduction that are applied to the crystal oscillator 100 while improving reliability of the crystal oscillator 100.

Also in this embodiment, the crystal resonator 101 is formed so as to have a substantially rectangular shape in plan view. The crystal resonator 101 is supported by the inner wall of the package 103 (i.e. the step part 104e of the package body 104) only at one end of the crystal resonator 101 in the long side direction in plan view. In contrast, in the crystal resonator plate 2 of the crystal resonator 101, the vibrating part 22 is connected to the external frame part 23 at the other end of the crystal resonator 101 in the long side direction in plan view. In this way, the position where the crystal resonator 101 is supported in the package 103 and the position where the vibrating part 22 is connected on the crystal resonator plate 2 are separated from each other as the one end and the other end of the crystal resonator 101 in the long side direction in plan view. Thus, it is possible to ensure a long heat conduction path from the package 103 to the vibrating part 22 of the crystal resonator plate 2. Therefore, even when the external temperature drastically changes, it is possible to prevent rapid change in the temperature of the vibrating part 22 of the crystal resonator plate 2, which leads to reduction in variations of the oscillation characteristic of the crystal oscillator 100 and in generation of noise components, both caused by the change in the external temperature.

Also in this embodiment, the package body 104 of the package 103 in which the crystal resonator 101 and the IC chip 102 are housed is made of ceramic while the crystal resonator plate 2, the first sealing member 3 and the second sealing member 4 of the crystal resonator 101 are made of crystal. Thus, since the thermal conductivity of the crystal resonator plate 2 and the like of the crystal resonator 101 is smaller than the thermal conductivity of the package body 104 of the package 103, it is possible to prevent rapid change in the temperature of the vibrating part 22 of the crystal resonator plate 2, which leads to reduction in variations of the oscillation characteristic of the crystal oscillator 100 caused by the change in the external temperature.

The present invention may be embodied in other forms without departing from the gist or essential characteristics thereof. The above-disclosed embodiment is therefore to be considered in all respects as illustrative and not limiting. The scope of the invention is indicated by the appended claims rather than by the foregoing description, and all modifications and changes that come within the meaning and range of equivalency of the claims are intended to be embraced therein.

In the above-described embodiment, the crystal resonator plate 2 is made of AT-cut crystal, however, the present invention is not limited thereto. It may be made of crystal other than the AT-cut crystal. Also in the above-described embodiment, the first sealing member 3 and the second sealing member 4 are made of crystal, however, the present invention is not limited thereto. They may be made of an insulating material such as glass.

In the above-described embodiment, the present invention is exemplarily applied to the crystal oscillator. However, the present invention is not limited thereto. The present invention may be applied to another resonator device such as a crystal resonator. When the present invention is applied to a crystal resonator, for example, the IC chip 102 in FIG. 1 is omitted, and the pair of electrode pads formed on the step part 104e of the package body 104 is directly (i.e. without interposition of the IC chip 2) connected to a pair of external connection terminals 106 formed on the bottom surface of the package body 104. With this crystal resonator, the vibrating part 22 of the crystal resonator plate 2 is doubly hermetically sealed by the resonator package 12 and the package 103. Thus, even when the external environment changes, it is possible to reduce variations of the piezoelectric oscillation characteristic of the crystal resonator, and also to prevent generation of noise components in the piezoelectric oscillation characteristic of the crystal resonator.

Figure 9:
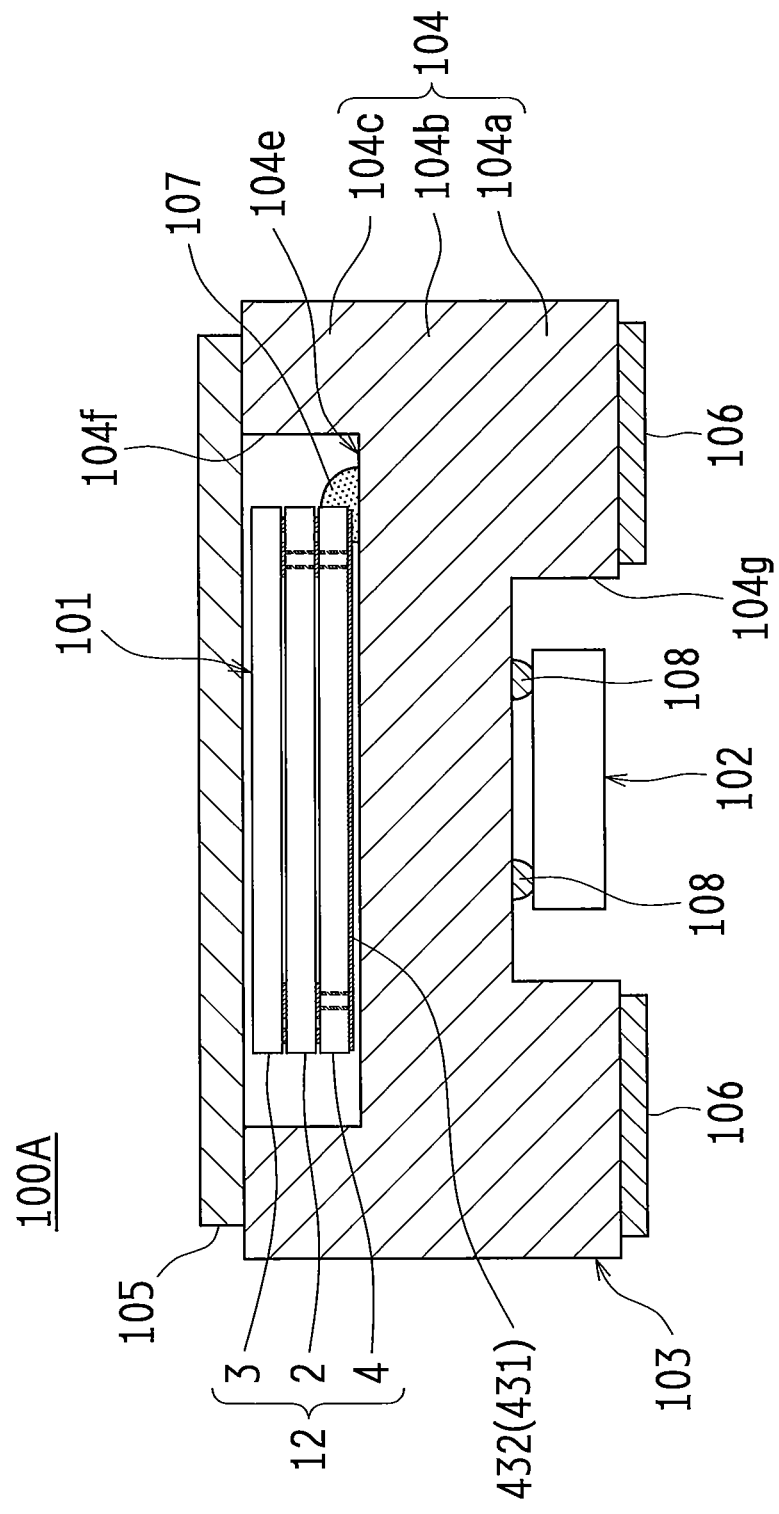
FIG. 9 is a schematic configuration diagram illustrating a crystal oscillator according to Variation 1.

In the above-described embodiment, the case in which the crystal resonator 101 and the IC chip 102 are housed in the same space in the package 103 is described. However, the present invention is not limited thereto. The crystal resonator 101 and the IC chip 102 may be housed respectively in different spaces in the package 103. For example, as shown in a crystal oscillator 100A in FIG. 9 (Variation 1), the crystal resonator 101 may be housed in a recess part 104d formed in a first main surface of the package body 104 while the IC chip 102 may be housed in a second recess part 104g formed in a second main surface of the package body 104. With the crystal oscillator 100A in FIG. 9, heat and/or electromagnetic waves emitted (radiated) from the IC chip 102 can be insulated or reduced by the package body 104. Thus, it is possible to prevent the vibrating part 22 of the crystal resonator 101 from being affected by the heat and/or electromagnetic waves from the IC chip 102. In the example shown in FIG. 9, the IC chip 102 is mounted on the bottom surface of the second recess part 104g. However, the IC chip 102 may be mounted on a mounting board that is not shown.

Also in the above-described embodiment, the case in which the crystal resonator 101 and the IC chip 102 are vertically arranged in the package 103 is described. However, the present invention is not limited thereto. The crystal resonator 101 and the IC chip 102 may be horizontally arranged in the package 103, i.e. they may be arranged side-by-side (or at front side and rear). In this case, the crystal resonator 101 and the IC chip 102 may be arranged in the same space of the package 103, or may be arranged respectively in different spaces in the package 103. By arranging the crystal resonator 101 and the IC chip 102 horizontally as described above, it is possible to substantially match the distance from the mounting board to the vibrating part 22 of the crystal resonator 101 with the distance from the mounting board to the IC chip 102. In other words, it is possible to substantially match the length of the heat conduction path from the mounting board to the vibrating part 22 of the crystal resonator 101 with the length of the heat conduction path from the mounting board to the IC chip 102. Thus, it is possible to reduce frequency drift caused by difference in the temperature between the vibrating part 22 of the crystal resonator 101 and the IC chip 102.

Figure 10:
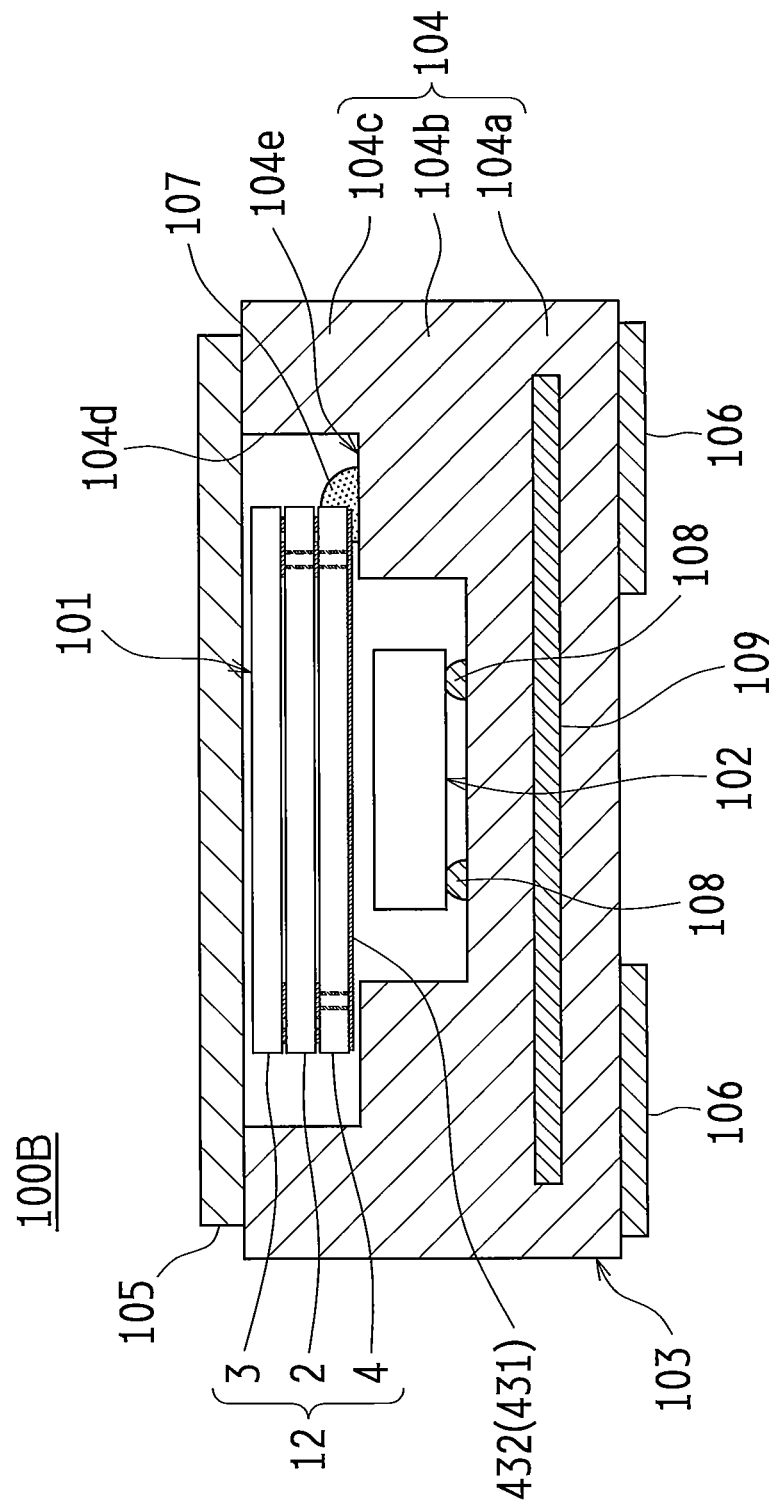
FIG. 10 is a schematic configuration diagram illustrating a crystal oscillator according to Variation 2.

Also, for example, as shown in a crystal oscillator 100B in FIG. 10 (Variation 2), a shield member 109 may be provided in the package body 104. In the crystal oscillator 100B shown in FIG. 10, the shield member 109 is provided inside the bottom wall part 104a of the package body 104. In this case, the bottom wall part 104a is made as a two-layered ceramic substrate, and the shield member 109 is interposed between the two layers of the ceramic substrate. With the crystal oscillator 100B shown in FIG. 10, the shield member 109 can prevent characteristic variations of the crystal oscillator 100B before and after mounting. Also, the shield member 109 can improve electromagnetic shielding performance (EMC) of the crystal oscillator 100B.

In the above-described embodiment, the crystal resonator 101 and the IC chip 102 are mounted on the package 103. However, the present invention is not limited thereto. A sensor element may be mounted on the package 103 in place of the IC chip 102. For example, when a thermistor is mounted on the package 103 as the sensor element, it is possible to configure a crystal resonator with a temperature sensor.

Also in the above-described embodiment, the case is described, in which the crystal resonator 101 formed in a substantially rectangular shape in plan view is supported by the inner wall of the package 103 only at one end of the crystal resonator 101 in the long side direction. However, the present invention is not limited thereto. The crystal resonator 101 may be supported by the inner wall of the package 103 at both ends of the crystal resonator 101 in the long side direction. For example, as shown in a crystal resonator unit 100C in FIGS. 11 to 13 (Variation 3), the crystal resonator 101 may be supported by the inner wall of the package 103 at four corner regions (four parts) of the crystal resonator 101. In this way, by supporting the crystal resonator 101 on both ends in the long side direction, the crystal resonator 101 can be further stably supported by the package 103, which results in improvement of impact resistance as well as vibration resistance (for example, resistance to ultrasonic vibration and the like at the time of flip chip bonding (FCB)) of the crystal resonator unit 100C. In this case, by adopting four point support as the supporting manner of the crystal resonator 101 by the package 103, it is possible to further improve impact resistance and vibration resistance of the crystal resonator unit 100C.

Figure 11:
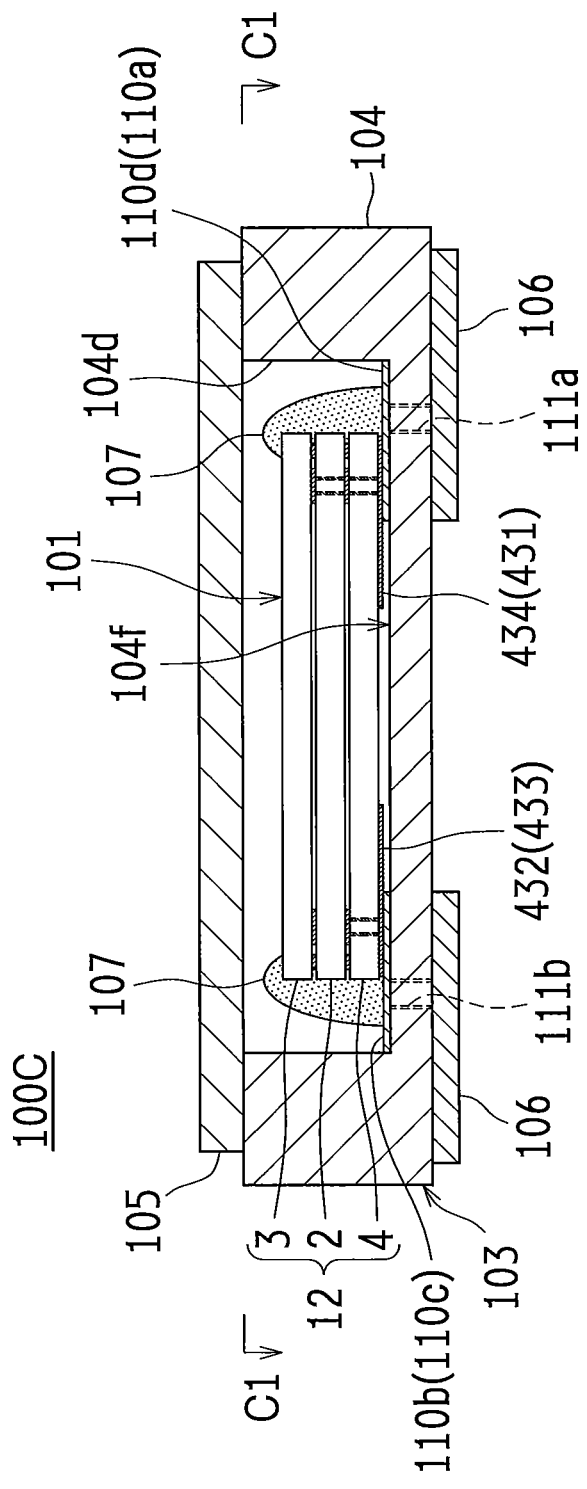
FIG. 11 is a schematic configuration diagram illustrating a crystal resonator unit according to Variation 3.
Figure 12:
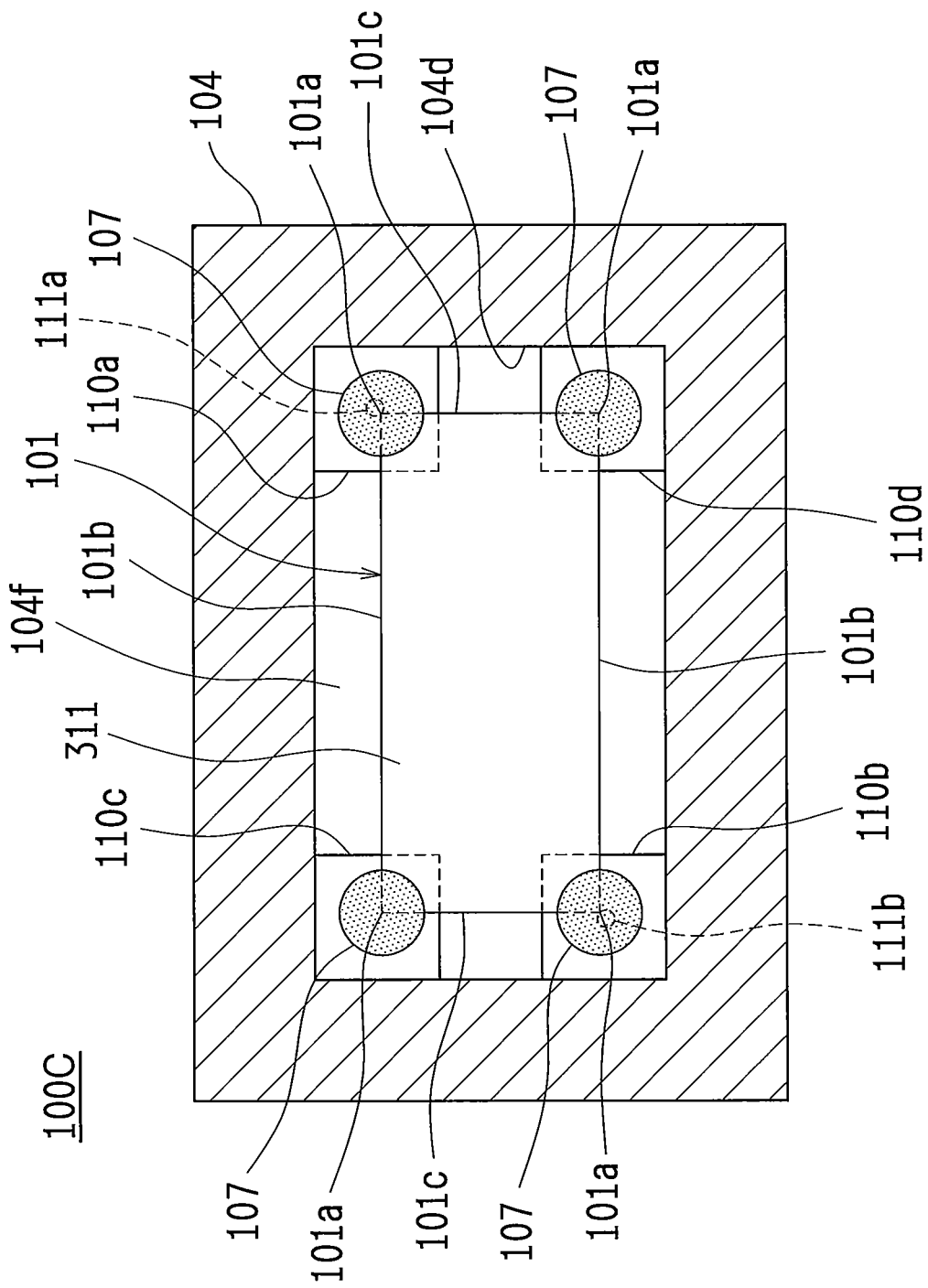
FIG. 12 is a cross-sectional view taken from line C1-C1 of FIG. 11.
Figure 13:
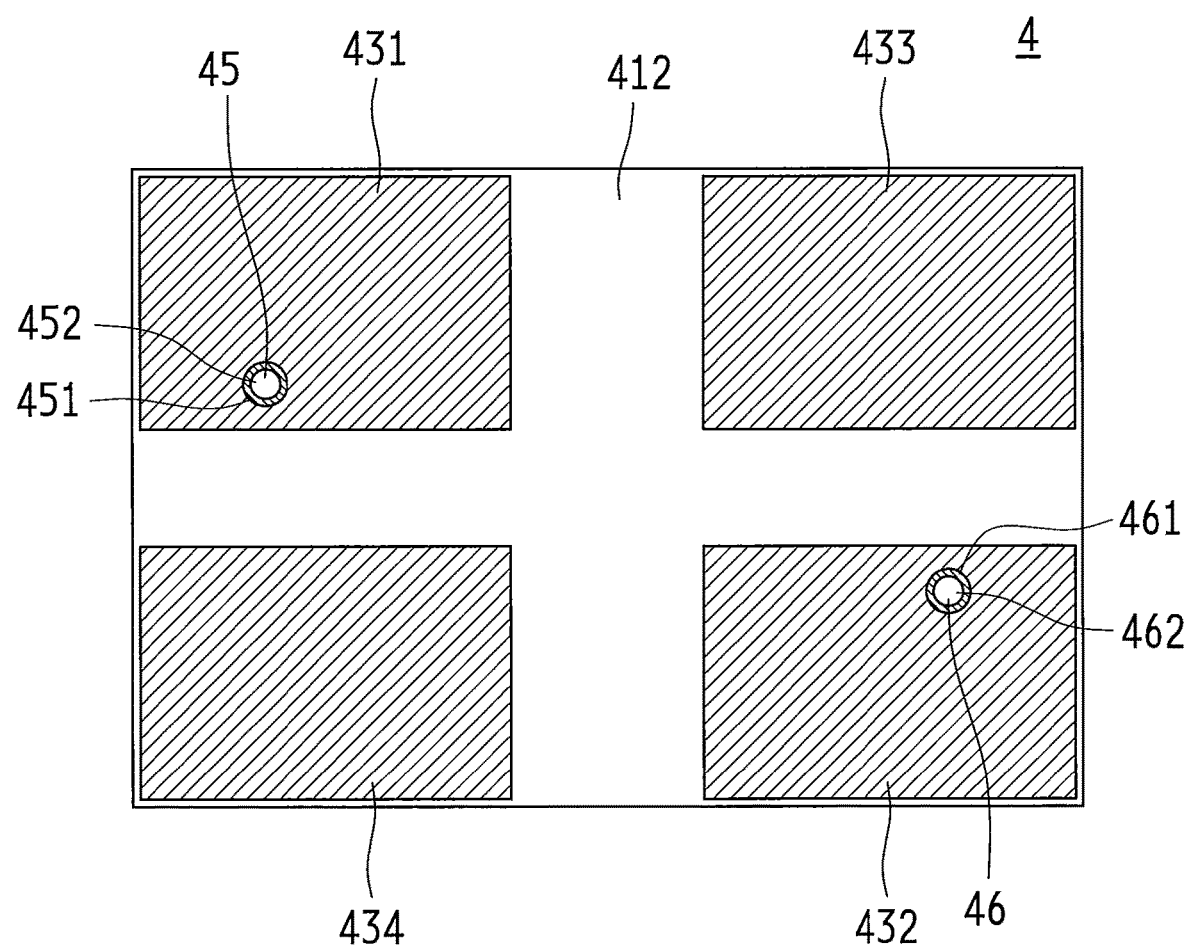
FIG. 13 is a diagram illustrating a second sealing member of a crystal resonator of the crystal resonator unit of FIG. 11, which corresponds to FIG. 8 as a diagram.

In the crystal resonator unit 100C as shown in FIGS. 11 to 13, the crystal resonator 101 is supported by a bottom surface 104f of the package body 104 as the inner wall of the package 103 via the conductive adhesive 107. As the conductive adhesive 107, it is possible to use synthetic resins such as silicone-based resins, polyimide-based resins, and epoxy-based resins. However, the present invention is not limited thereto. A brazing material or solder may also be used.

Unlike the above-described embodiment (see FIG. 1), in the case of the crystal resonator unit 100C shown in FIGS. 11 to 13, only the crystal resonator 101 is housed in the recess part 104d of the package body 104, and the IC chip is not housed. Also, no step part is provided on the bottom surface 104f of the recess part 104d of the package body 104. That is, the bottom surface 104f is formed as a flat surface. On the four corner regions of the bottom surface 104f of the recess part 104d of the package body 104, electrode pads 110a to 110d are respectively formed. Out of the four electrode pads 110a to 110d, two (a pair of) electrode pads 110a and 110b arranged on the diagonal line are electrically connected to the external connection terminals 106 formed on the bottom surface (on the back) of the package body 104 via through holes 111a and 111b formed inside the package body 104. Out of the four electrode pads 110a to 110d, the remaining two electrode pads 110c and 110d are disposed as dummy terminals (NC terminals) that do not have any relation with the electrical connection. The electrode pads 110a and 110b may be electrically connected to the external connection terminals 106 using castellation provided on the side surfaces of the package body 104 in place of the through holes.

Also, the two electrode pads 110a and 100b are electrically connected, each via the conductive adhesive 107, to the external electrode terminals 431 and 432 formed on the second main surface 412 of the second sealing member 4. Unlike the above-described embodiment (see FIG. 8), in this case, the external electrode terminals 431 and 432 formed on the second main surface 412 of the second sealing member 4 are provided on two regions on the diagonal line out of the four corner regions of the second main surface 412 of the second sealing member 4, as shown in FIG. 13. Out of the four corner regions of the second main surface 412 of the second sealing member 4, external electrode terminals 433 and 434 are provided on the remaining two regions. The external electrode terminals 433 and 434 are provided as dummy terminals (NC terminals) that do not have any relation with the electrical connection. Similarly to the above, the external connection terminals 106 of the package body 104 are provided on the four corner regions of the bottom surface of the package body 104. Two external connection terminals 106 on the diagonal line are used to electrical connection, and the remaining two external connection terminals 106 are dummy terminals (NC terminals) that do not have any relation with the electrical connection. However, the configuration in which only two external connection terminals 106 of the package body 104 are provided may also be used, where no dummy terminal is provided.

In this way, the first excitation electrode 221 of the vibrating part 22 of the crystal resonator 101 is electrically connected to the external connection terminal 106 of the bottom surface of the package body 104 via the first extraction electrode 223, the wiring pattern 33, the first through hole 26, the second through hole 45, the external electrode terminal 431, the electrode pad 110a and the through hole 111a. Also, the second excitation electrode 222 of the vibrating part 22 of the crystal resonator 101 is electrically connected to the external connection terminal 106 of the bottom surface of the package body 104 via the second extraction electrode 224, the third through hole 46, the external electrode terminal 432, the electrode pad 110b and the through hole 111b.

Also in the crystal resonator unit 100C shown in FIG. 11, the conductive adhesives 107 are each arranged so as to extend from the bottom surface (the second main surface 412 of the second sealing member 4) of the crystal resonator 101 to reach the top surface (the first main surface 311 of the first sealing member 3) of the crystal resonator 101 via the side surface of the crystal resonator 101. That is, each conductive adhesive 107 is applied on the crystal resonator 101 like a coating. Thus, the crystal resonator 101 can be further stably supported by the package 103 using the conductive adhesive 107, which results in improvement of impact resistance as well as vibration resistance of the crystal resonator unit 100C. The conductive adhesive 107 may also be arranged so as to reach the vicinity of the top surface of the crystal resonator 101 (for example, the side surface of the first sealing member 3), not to reach the top surface of the crystal resonator 101. In this case, it is possible to further reduce the height of the crystal resonator unit 100C.

In the configuration shown in FIGS. 11 to 13, the crystal oscillator may be formed by housing the crystal resonator 101 and the IC chip in the recess part 104d of the package body 104. In this case, the electrical connection to the first and second excitation electrodes 221 and 222 of the crystal resonator 101 and to the IC chip may be performed using also the above-described external connection terminals 106 of the package body 104, the electrode pads 110c and 110d, and the external electrode terminals 433 and 434 of the second sealing member 4, which are all formed as the dummy terminals (NC terminals).

Figure 14:
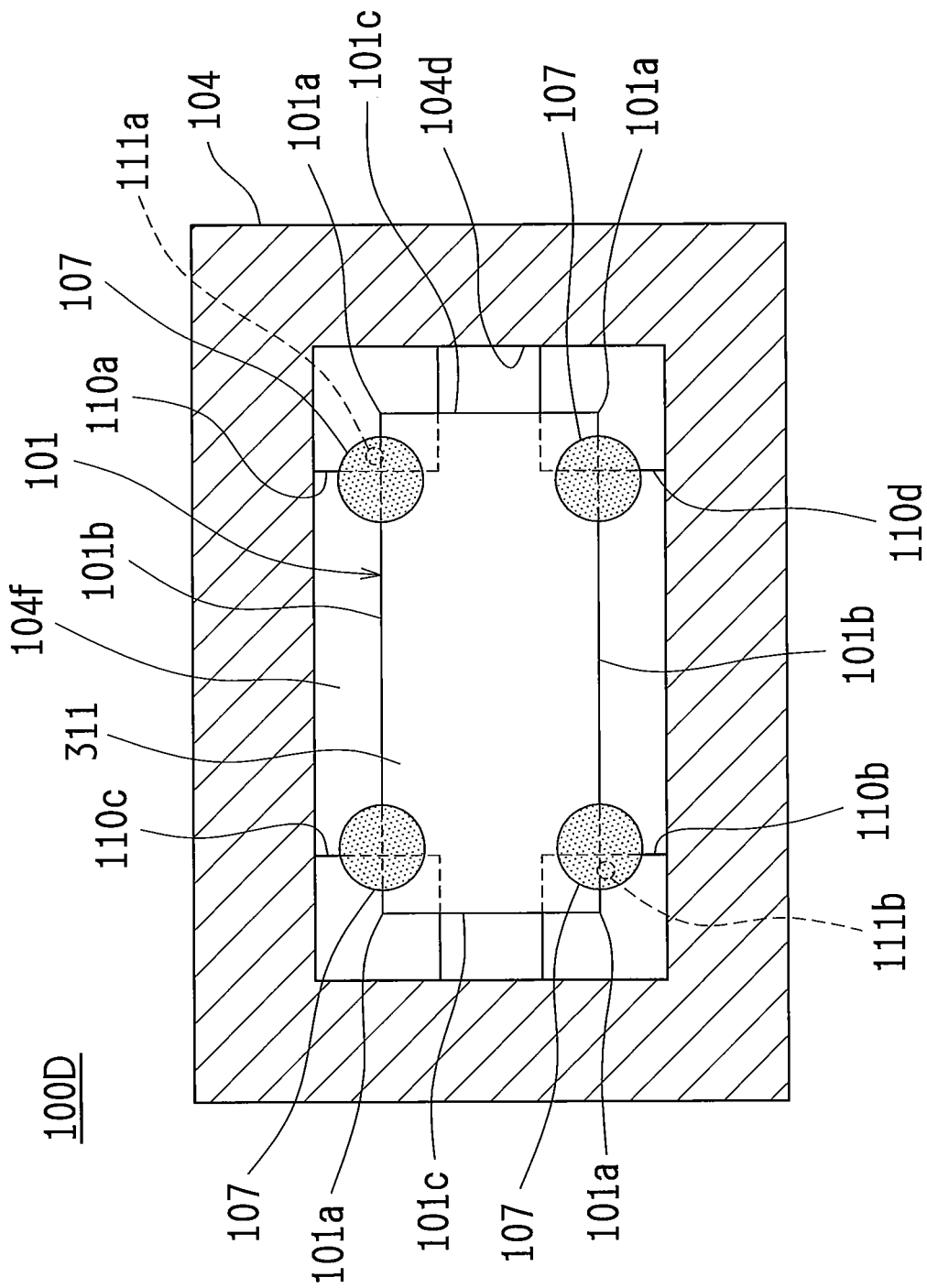
FIG. 14 is a diagram illustrating a crystal resonator unit according to Variation 4, which corresponds to FIG. 12 as a diagram.
Figure 15:
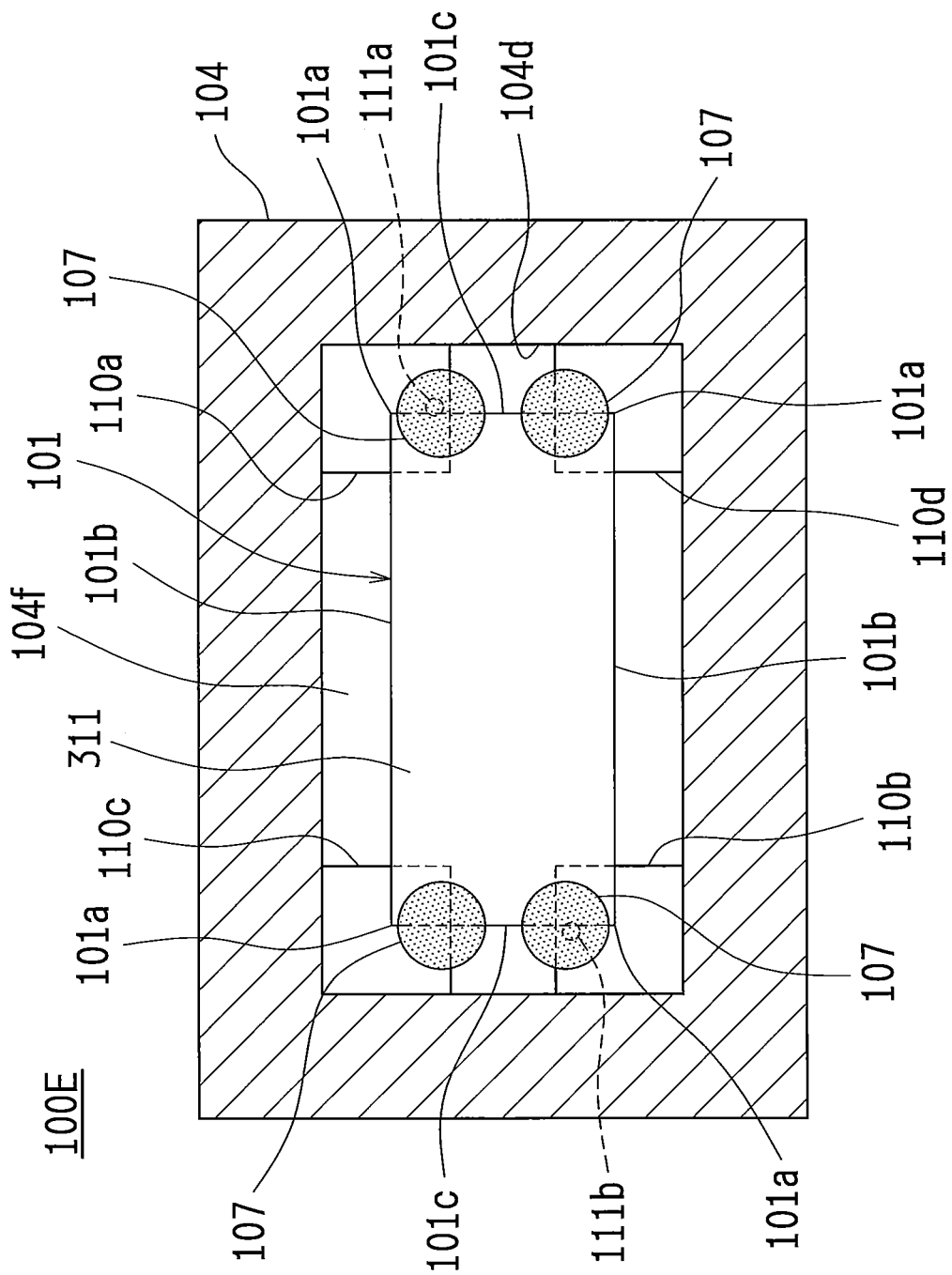
FIG. 15 is a diagram illustrating a crystal resonator unit according to Variation 5, which corresponds to FIG. 12 as a diagram.

Also, it is sufficient that the conductive adhesives 107 are provided on the four corner regions of the crystal resonator 101. That is, the conductive adhesives 107 may be arranged so as to avoid four respective corner parts (vertices) 101a of the crystal resonator 101. For example, as shown in a crystal resonator unit 100D in FIG. 14 (Variation 4), the conductive adhesives 107 may be provided on a pair of long sides 101b of the crystal resonator 101, or as shown in a crystal resonator unit 100E in FIG. 15 (Variation 5), the conductive adhesives 107 may be provided on a pair of short sides 101c of the crystal resonator 101.

In Variations 3 to 5 shown in FIGS. 11 to 15, the crystal resonator 101 is attached to the inner wall of the package 103 by four point support. However, the present invention is not limited thereto. As the configuration in which the crystal resonator 101 is supported by the inner wall of the package 103 at both ends of the crystal resonator 101 in the long side direction, the crystal resonator 101 may be supported by the inner wall of the package 103 at least at two regions out of the four corner regions of the crystal resonator 101. That is, the crystal resonator 101 may be attached to the inner wall of the package 103 by two point support, three point support, or five point support or more.

Also in Variations 3 to 5 shown in FIGS. 11 to 15, the crystal resonator 101 is arranged at a substantially central position of the recess part 104d of the package body 104. However, the present invention is not limited thereto. The crystal resonator 101 may be arranged so as to displace from the substantially central position of the recess part 104d of the package body 104.

In the above-described embodiments, the crystal resonator hermetically sealed in the package 103 is a single crystal resonator. However, the present invention is not limited thereto. A crystal resonator with a sensor (that is, crystal resonator with which a sensor element, e.g. a thermistor, is integrally formed) may be hermetically sealed in the package 103, or a crystal oscillator (i.e. crystal resonator with which an IC chip constituting an oscillation circuit is integrally formed) may be hermetically sealed in the package 103.

This application claims priority based on Patent Application No. 2016-223303 filed in Japan on Nov. 16, 2016. The entire contents thereof are hereby incorporated in this application by reference.

INDUSTRIAL APPLICABILITY

The present invention is suitably applied to the crystal resonator device including a crystal resonator having a sandwich structure.

DESCRIPTION OF REFERENCE NUMERALS

100 Crystal oscillator
101 Crystal resonator
12 Resonator package
13 Internal space
2 Crystal resonator plate
22 Vibrating part
221 First excitation electrode
222 Second excitation electrode
23 External frame part
24 Connecting part
3 First sealing member
4 Second sealing member
102 IC chip (circuit element)
102 Package
104 Package body
105 Lid

The invention claimed is:

1. A crystal resonator device comprising a crystal resonator that is hermetically sealed in a package made of an insulating material,
wherein the crystal resonator includes:
a crystal resonator plate including a first excitation electrode formed on a first main surface thereof, and a second excitation electrode formed on a second main surface thereof, the second excitation electrode making a pair with the first excitation electrode;
a first sealing member covering the first excitation electrode of the crystal resonator plate; and
a second sealing member covering the second excitation electrode of the crystal resonator plate,
wherein a vibrating part including the first excitation electrode and the second excitation electrode of the crystal resonator plate is hermetically sealed by the first sealing member bonded to the crystal resonator plate and the second sealing member bonded to the crystal resonator plate,
a hermetically-sealed inside space of the crystal resonator has a degree of vacuum higher than that of a hermetically-sealed inside space of the package,
the first sealing member and the crystal resonator plate are bonded by Au—Au bonding, with a gap not more than 1.00 μm between the first sealing member and the crystal resonator plate, and
the second sealing member and the crystal resonator plate are bonded by Au—Au bonding, with a gap not more than 1.00 μm between the second sealing member and the crystal resonator plate.

2. The crystal resonator device according to claim 1,
wherein the crystal resonator is formed so as to have a substantially rectangular shape in plan view, and the crystal resonator is supported by an inner wall of the package only at one end of the crystal resonator in a long side direction in plan view, and
wherein the crystal resonator plate of the crystal resonator includes: the vibrating part; an external frame part that surrounds an outer periphery of the vibrating part; and a connecting part that connects the vibrating part to the external frame part, and that is disposed only at another end of the crystal resonator in the long side direction in plan view.

3. The crystal resonator device according to claim 1,
wherein the crystal resonator is formed so as to have a substantially rectangular shape in plan view, and the crystal resonator is supported by an inner wall of the package at both ends of the crystal resonator in a long side direction in plan view, and
wherein the crystal resonator plate of the crystal resonator includes: the vibrating part; an external frame part that surrounds an outer periphery of the vibrating part; and a connecting part that connects the vibrating part to the external frame part.

4. The crystal resonator device according to claim 3,
wherein the crystal resonator is supported by the inner wall of the package at four corner regions of the crystal resonator.

5. The crystal resonator device according to claim 1,
wherein the crystal resonator is supported by an inner wall of the package via a conductive adhesive, and
wherein the conductive adhesive is arranged so as to extend from a bottom surface of the crystal resonator to reach a top surface of the crystal resonator via a side surface of the crystal resonator.

6. The crystal resonator device according to claim 1,
wherein a sensor element or a circuit element constituting an oscillation circuit is integrally formed with the crystal resonator.

7. The crystal resonator device according to claim 1,
wherein the crystal resonator, and a sensor element or a circuit element constituting an oscillation circuit are housed and hermetically sealed in a same space provided in the package.

8. The crystal resonator device according to claim 1,
wherein the crystal resonator is housed and hermetically sealed in a first recess part formed in a first main surface of the package, and
wherein a sensor element or a circuit element constituting an oscillation circuit is housed in a second recess part formed in a second main surface of the package.

9. The crystal resonator device according to claim 1,
wherein a package body of the package that houses the crystal resonator is made of ceramic.

* * * * *